US012676184B2

(12) United States Patent
Kim et al.

(10) Patent No.: US 12,676,184 B2
(45) Date of Patent: Jul. 7, 2026

(54) VOLTAGE REGULATOR, MEMORY DEVICE INCLUDING VOLTAGE REGULATOR, AND OPERATION METHOD OF MEMORY DEVICE

(71) Applicant: Samsung Electronics Co., Ltd., Suwon-si (KR)

(72) Inventors: Seongjin Kim, Suwon-si (KR); Sang-Wan Nam, Suwon-si (KR); Sungho Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 18/377,751

(22) Filed: Oct. 6, 2023

(65) Prior Publication Data

US 2024/0161816 A1     May 16, 2024

(30) Foreign Application Priority Data

Nov. 11, 2022     (KR) ........................ 10-2022-0150645

(51) Int. Cl.
| | |
|---|---|
| *G11C 11/4074* | (2006.01) |
| *G11C 5/14* | (2006.01) |
| *G11C 11/4096* | (2006.01) |
| *G11C 11/4099* | (2006.01) |
| *G11C 7/12* | (2006.01) |
| *G11C 8/08* | (2006.01) |

(52) U.S. Cl.
CPC .......... *G11C 11/4099* (2013.01); *G11C 5/147* (2013.01); *G11C 11/4074* (2013.01); *G11C 11/4096* (2013.01); *G11C 7/12* (2013.01); *G11C 8/08* (2013.01)

(58) Field of Classification Search
CPC . G11C 11/4099; G11C 5/147; G11C 11/4074; G11C 11/4096
USPC .......................................................... 365/226
See application file for complete search history.

(56) References Cited

U.S. PATENT DOCUMENTS

| | | | |
|---|---|---|---|
| 5,144,585 | A | 9/1992 | Min et al. |
| 5,901,102 | A | 5/1999 | Furutani |
| 8,860,389 | B2 | 10/2014 | Gakhar et al. |
| 9,841,777 | B2 | 12/2017 | Enjalbert et al. |
| 10,747,250 | B2 | 8/2020 | Lee et al. |
| 2006/0091938 | A1 | 5/2006 | Kim |

(Continued)

FOREIGN PATENT DOCUMENTS

| | | |
|---|---|---|
| CN | 110045774 A | 7/2019 |

*Primary Examiner* — Ly D Pham
(74) *Attorney, Agent, or Firm* — Muir Patent Law, PLLC

(57) ABSTRACT

A memory device may include a reference voltage generator that generates a reference voltage, a voltage regulator that includes a plurality of driving blocks generating an internal voltage based on the reference voltage, and a power line that receives the internal voltage. At least one of the plurality of driving blocks may include a first unit driver that generates a first output current flowing through the power line based on the reference voltage and a change in the internal voltage, and a second unit driver that generates a second output current larger than the first output current flowing through the power line, based on the reference voltage and the change in the internal voltage. The first unit driver may generate the first output current faster than the second output current of the second unit driver.

16 Claims, 18 Drawing Sheets

(56)            References Cited

U.S. PATENT DOCUMENTS

2008/0122415 A1* 5/2008 Chou ........................ G05F 1/56
                                              323/282
2009/0147594 A1* 6/2009 Chou .................... G11C 5/147
                                              327/535
2009/0243510 A1* 10/2009 Pauritsch .............. H05B 45/37
                                              340/12.33
2014/0111173 A1    4/2014 Lee
2020/0285261 A1    9/2020 Sankman et al.
2020/0403515 A1   12/2020 Burton

* cited by examiner

VOLTAGE REGULATOR, MEMORY DEVICE INCLUDING VOLTAGE REGULATOR, AND OPERATION METHOD OF MEMORY DEVICE

CROSS-REFERENCE TO RELATED APPLICATION(S)

This application claims priority under 35 U.S.C. § 119 to Korean Patent Application No. 10-2022-0150645 filed on Nov. 11, 2022, in the Korean Intellectual Property Office, the disclosure of which is incorporated by reference herein in its entirety.

BACKGROUND

Example embodiments of the present disclosure described herein relate to a semiconductor memory, and more particularly, relate to a voltage regulator, a memory device including the voltage regulator, and an operation method of the memory device.

A semiconductor memory is classified as a volatile memory, in which stored data disappear when a power is turned off, such as a static random access memory (SRAM) or a dynamic random access memory (DRAM), or a non-volatile memory, in which stored data are retained even when a power is turned off, such as a flash memory device, a phase-change RAM (PRAM), a magnetic RAM (MRAM), a resistive RAM (RRAM), or a ferroelectric RAM (FRAM).

The flash memory device is being widely used as a high-capacity storage medium. Nowadays, as the performance of the flash memory device is improved, power consumption or a load current in the flash memory device is increasing. Also, as the degree of integration of the flash memory device is improved, the chip size of the flash memory device is decreasing. A way to increase the size of a voltage generating circuit is used to cope with the increase in the power consumption or load current in the flash memory device, which causes an increase in the area of the flash memory device. Therefore, it is desired to increase the load current of the flash memory device without increasing the size of the voltage generating circuit.

SUMMARY

Example embodiments of the present disclosure provide a voltage regulator with a reduced area and improved performance, a memory device including the voltage regulator, and an operation method of the memory device.

According to an embodiment, a memory device includes a reference voltage generator that generates a reference voltage, a voltage regulator that includes a plurality of driving blocks generating an internal voltage based on the reference voltage, and a power line that receives the internal voltage. At least one of the plurality of driving blocks includes a first unit driver that generates a first output current flowing through the power line based on the reference voltage and a change in the internal voltage, and a second unit driver that generates a second output current larger than the first output current flowing through the power line, based on the reference voltage and the change in the internal voltage. The first unit driver may generate the first output current faster than the second output current of the second unit driver.

According to an embodiment, an operation method of a memory device which includes a plurality of driving blocks configured to output an internal voltage to a power line includes enabling n driving blocks among the plurality of driving blocks, in a first operating period in which a first load current is used, n being a natural number, and enabling m driving blocks among the plurality of driving blocks, in a second operating period in which a second load current larger than the first load current is used, m being a natural number greater than n. The enabling of the n driving blocks includes, by a first unit driver of at least one of the plurality of driving blocks, generating a first output current flowing through the power line based on a reference voltage and a change in the internal voltage and by a second unit driver of the at least one driving block, a second output current larger than the first output current flowing through the power line, based on the reference voltage and the change in the internal voltage. The generating of the first output current occurs faster than the generating of the second output current.

According to an embodiment, a voltage regulator includes a first amplifier that receives a reference voltage through a first inverting input terminal, receives a first output voltage through a first non-inverting input terminal, and outputs a first comparison signal through a first output terminal, a first pass transistor that is connected between an external voltage and the first output voltage and operates in response to the first comparison signal, a second amplifier that receives the reference voltage through a second inverting input terminal, receives the first output voltage through a second non-inverting input terminal, and outputs a second comparison signal through a second output terminal, and a second pass transistor that is connected between the external voltage and the first output voltage and operates in response to the second comparison signal. A size of the first pass transistor is smaller than a size of the second pass transistor and a size of the first amplifier is identical to a size of the second amplifier.

BRIEF DESCRIPTION OF THE FIGURES

The above and other objects and features of the present disclosure will become apparent by describing in detail embodiments thereof with reference to the accompanying drawings.

FIG. 11 is a diagram for describing an operation according to the flowchart of FIG. 10 according to example embodiments.

FIG. 12 is a diagram for describing a configuration of a voltage generating circuit of FIG. 1 according to example embodiments.

FIG. 15 is a block diagram illustrating a memory system according to an embodiment of the present disclosure.

DETAILED DESCRIPTION

Below, embodiments of the present disclosure will be described in detail and clearly to such an extent that an ordinary one in the art easily implements the invention.

Figure 1:
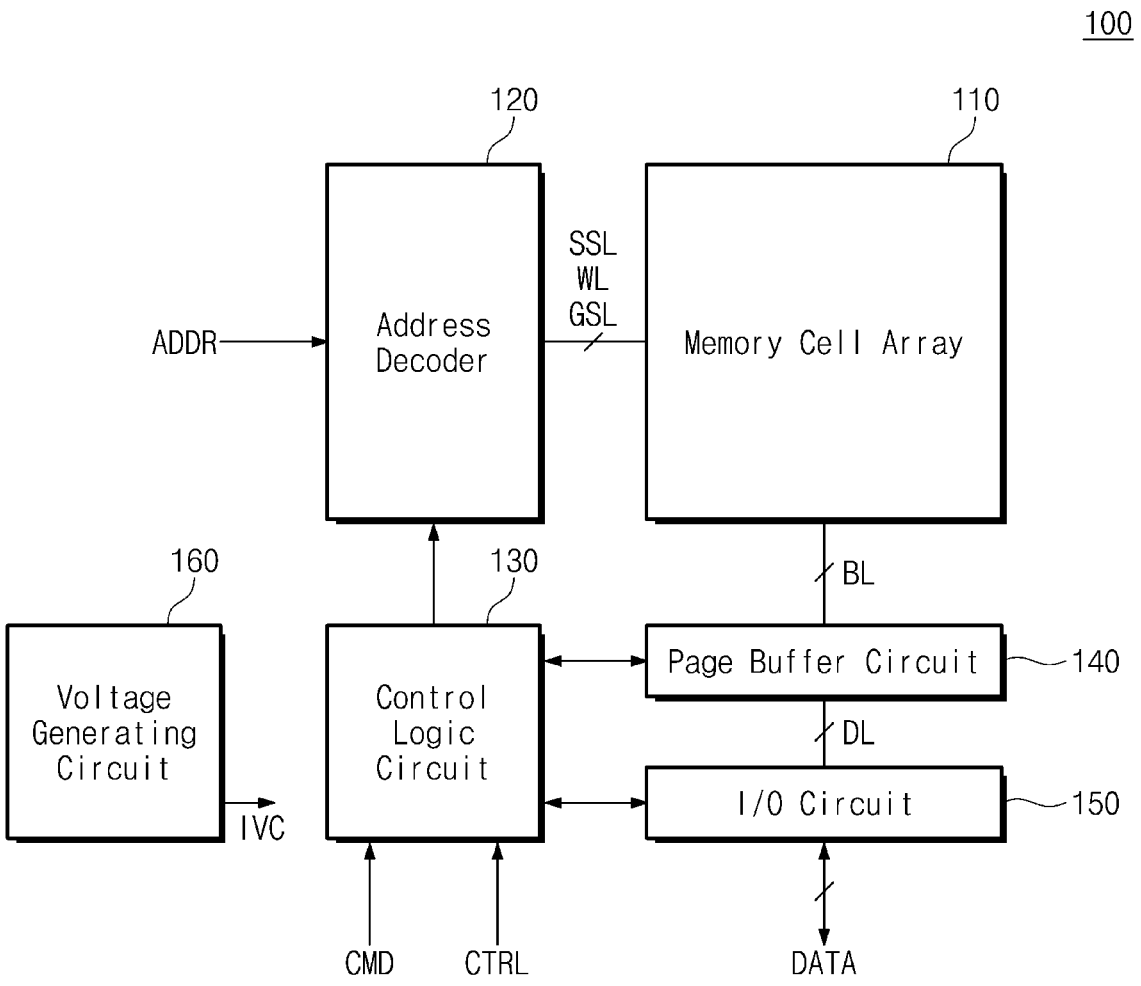
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, an address decoder (or row decoder) 120, a control logic circuit 130, a page buffer circuit 140, an input/output circuit 150, and a voltage generating circuit 160.

The memory cell array 110 may include a plurality of memory blocks. Each of the plurality of memory blocks may include a plurality of cell strings, each of which includes a plurality of cell transistors. The plurality of cell transistors may be connected in series between bit lines BL and a common source line CSL and may be connected to string selection lines SSL, word lines WL, and ground selection lines GSL. In an embodiment, the plurality of memory blocks may have a three-dimensional structure including memory cells (or word lines) stacked in a direction perpendicular to a substrate, but the present disclosure is not limited thereto.

The address decoder 120 may be connected to the memory cell array 110 through the string selection lines SSL, the word lines WL, and the ground selection lines GSL. The address decoder 120 may receive an address ADDR from an external device (e.g., a memory controller) and may decode the received address ADDR. The address decoder 120 may control voltages of the string selection lines SSL, the word lines WL, and the ground selection lines GSL based on the decoding result.

The control logic circuit 130 may control various components of the memory device 100 in response to signals (e.g., a command CMD and a control signal CTRL) received from a memory controller.

The page buffer circuit 140 may be connected to the memory cell array 110 through the bit lines BL. The page buffer circuit 140 may read data stored in the memory cell array 110 by sensing voltage changes of the bit lines BL. The page buffer circuit 140 may store data in the memory cell array 110 by controlling voltages of the bit lines BL.

The input/output circuit 150 may receive data "DATA" from the external device (e.g., a memory controller) and may provide the received data "DATA" to the page buffer circuit 140 through data lines DL. The input/output circuit 150 may receive the data "DATA" from the page buffer circuit 140 through the data lines DL and may transfer the received data "DATA" to the external device.

The voltage generating circuit 160 may generate various voltages necessary for the memory device 100 to operate. For example, the voltage generating circuit 160 may generate various voltages such as a plurality of program voltages, a plurality of pass voltages, a plurality of verify voltages, a plurality of read voltages, a plurality of non-selection read voltages, a plurality of erase voltages, and a plurality of erase verify voltages. For brevity of drawing, an example in which various voltages generated from the voltage generating circuit 160 are provided to the control logic circuit 130 is illustrated in FIG. 1, but the present disclosure is not limited thereto. For example, various voltages generated from the voltage generating circuit 160 may be provided to various components of the memory device 100.

In an embodiment, the voltage generating circuit 160 may be configured to generate an internal voltage necessary for the memory device 100 to operate. A load current that is used in the memory device 100 may change depending on the operation status of the memory device 100, in this case, a level of the internal voltage may change. The voltage generating circuit 160 may include a voltage regulator for maintaining the internal voltage at a uniform level. The voltage regulator according to embodiments of the present disclosure may include a fast unit driver having a fast response speed and a large unit driver providing a large load current. As such, it may be possible to quickly react to the fluctuations of the load current through the fast unit driver and to stably provide the large load current through the large unit driver. A configuration and an operation of the voltage generating circuit 160 or the voltage regulator according to the present disclosure will be described in detail with reference to the following drawings.

Figure 2:
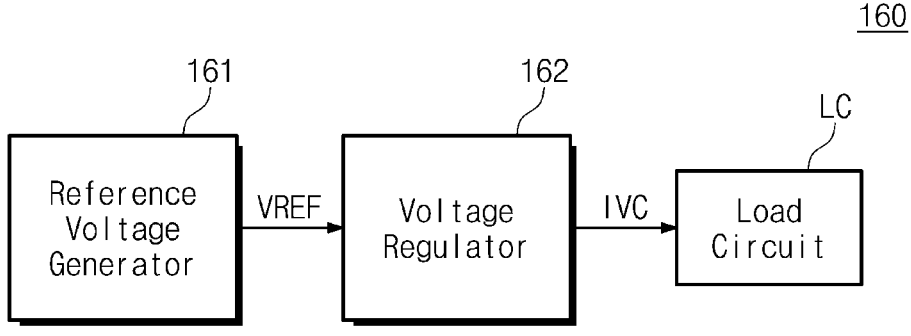
FIG. 2 is a block diagram illustrating a voltage generating circuit of FIG. 1 according to example embodiments.
Figure 3:
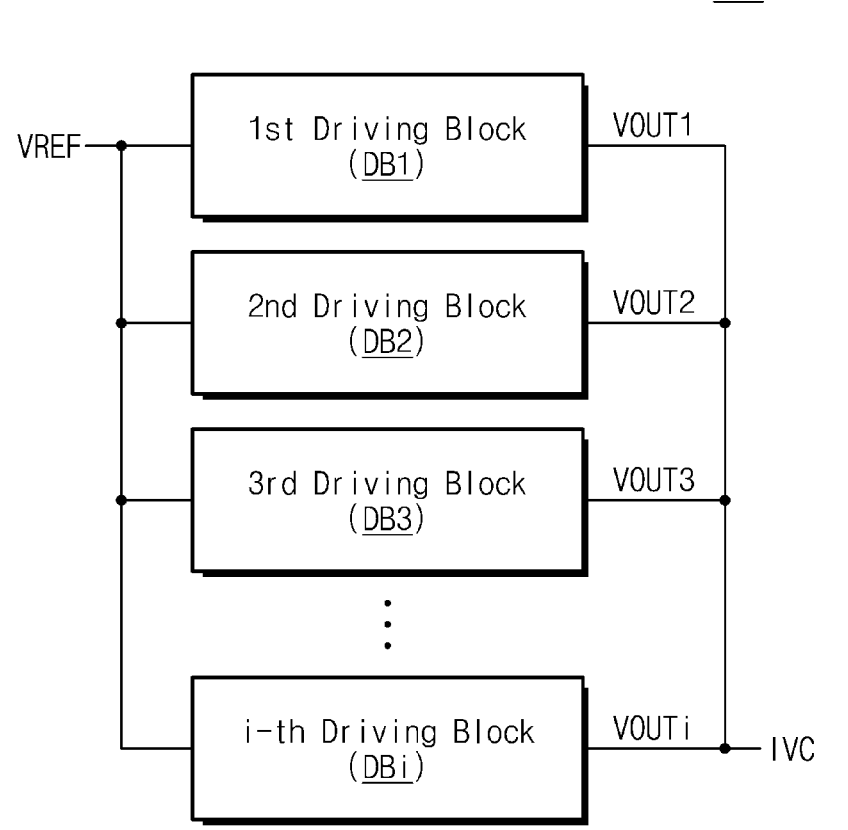
FIG. 3 is a block diagram illustrating a voltage regulator of FIG. 2 according to example embodiments.

FIG. 2 is a block diagram illustrating a voltage generating circuit of FIG. 1 according to example embodiments. FIG. 3 is a block diagram illustrating a voltage regulator of FIG. 2 according to example embodiments. For convenience, the description will be given based on an embodiment in which the voltage generating circuit 160 generates an internal voltage IVC. However, the present disclosure is not limited thereto. For example, the voltage generating circuit 160 may generate various operating voltages described above and may further include a plurality of voltage regulators configured to control the operation voltages, respectively. A configuration or an operation of each of the plurality of voltage regulators may be similar to that of a voltage regulator to be described below.

Referring to FIGS. 1 to 3, the voltage generating circuit 160 may include a reference voltage generator 161 and a voltage regulator 162. The reference voltage generator 161 may be configured to generate a reference voltage VREF. For example, the reference voltage generator 161 may include a band gap reference (BGR) circuit configured to generate the reference voltage VREF.

The voltage regulator 162 may output the internal voltage IVC based on the reference voltage VREF. The internal voltage IVC may be provided to a load circuit LC included in the memory device 100. In an embodiment, the load circuit LC may include at least one of various components (e.g., the memory cell array 110, the address decoder 120, the control logic circuit 130, the page buffer circuit 140, the input/output circuit 150, and the like) of the memory device 100, which use the internal voltage IVC.

The voltage regulator 162 may be configured to provide the stable internal voltage IVC by compensating for a change in the internal voltage IVC due to a change in the load current used in the load circuit LC. For example, as illustrated in FIG. 3, the voltage regulator 162 may include a plurality of driving blocks DB1 to DBi (i is a natural number greater than one). The plurality of driving blocks DB1 to DBi may respectively output a plurality of output voltages VOUT1 to VOUTi based on the reference voltage VREF. The plurality of output voltages VOUT1 to VOUTi may be provided to the load circuit LC as the internal voltage IVC.

In an embodiment, each of the plurality of driving blocks DB1 to DBi may include a plurality of unit drivers. Each of the plurality of unit drivers may be a low dropout (LDO) circuit configured to generate the stable output voltage based on the reference voltage VREF.

As described above, the voltage regulator 162 of the voltage generating circuit 160 may include the plurality of driving blocks DB1 to DBi, and the plurality of driving blocks DB1 to DBi may be configured to compensate for the change in the internal voltage IVC caused by the change in the load current.

Figure 4:
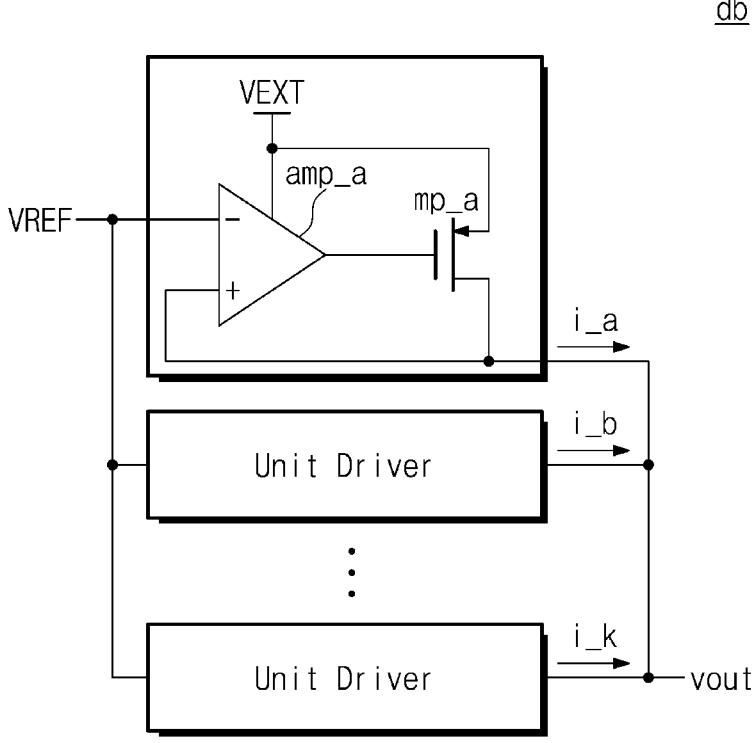
FIG. 4 is a diagram illustrating an example of a portion of a driving block.

FIG. 4 is a diagram illustrating an example of a portion of a driving block. Referring to FIG. 4, a driving block db may generate an output voltage vout based on the reference voltage VREF. In this case, the driving block db may stably provide the output voltage vout to the load circuit LC. For example, the driving block db may include a plurality of unit drivers.

Each of the plurality of unit drivers may be an LDO circuit. For example, one unit driver may include an amplifier amp_a and a pass transistor mp_a. An inverting input terminal (−) of the amplifier amp_a may be connected to the reference voltage VREF, and a non-inverting input terminal (+) of the amplifier amp_a may be connected to the output voltage vout. The pass transistor mp_a may be a PMOS transistor that is connected between an external voltage VEXT and the output voltage vout and is configured to operate in response to an output of the amplifier amp_a. When the output voltage vout is lower than a target level due to an increase in the load current, an output level of the amplifier amp_a may decrease, and thus, a current (i.e., i_a) flowing through the pass transistor mp_a may increase. As such, the output voltage vout may be stably maintained. Likewise, the remaining unit drivers may cope with the change in the load current by adjusting levels of a plurality of currents i_b to i_k.

In an embodiment, physical characteristics of the plurality of unit drivers included in the driving block db may be identical or similar. For example, amplifiers included in the plurality of unit drivers may have the same size or the same physical characteristic, and pass transistors included in the plurality of unit drivers may have the same size or the same physical characteristic.

In this case, when the load current changes sharply, a time taken to stabilize the output voltage vout may increase. The time taken to stabilize the output voltage vout may be shortened by improving a response characteristic of each of the plurality of unit drivers. However, in the case of improving the response characteristic of each of the plurality of unit drivers, magnitudes of the currents i_a to i_k respectively generated by the plurality of unit drivers may decrease. For this reason, there is a need to increase the number of unit drivers to satisfy the total load current. This means that the total area and power consumption of the voltage regulator increase.

Figure 5:
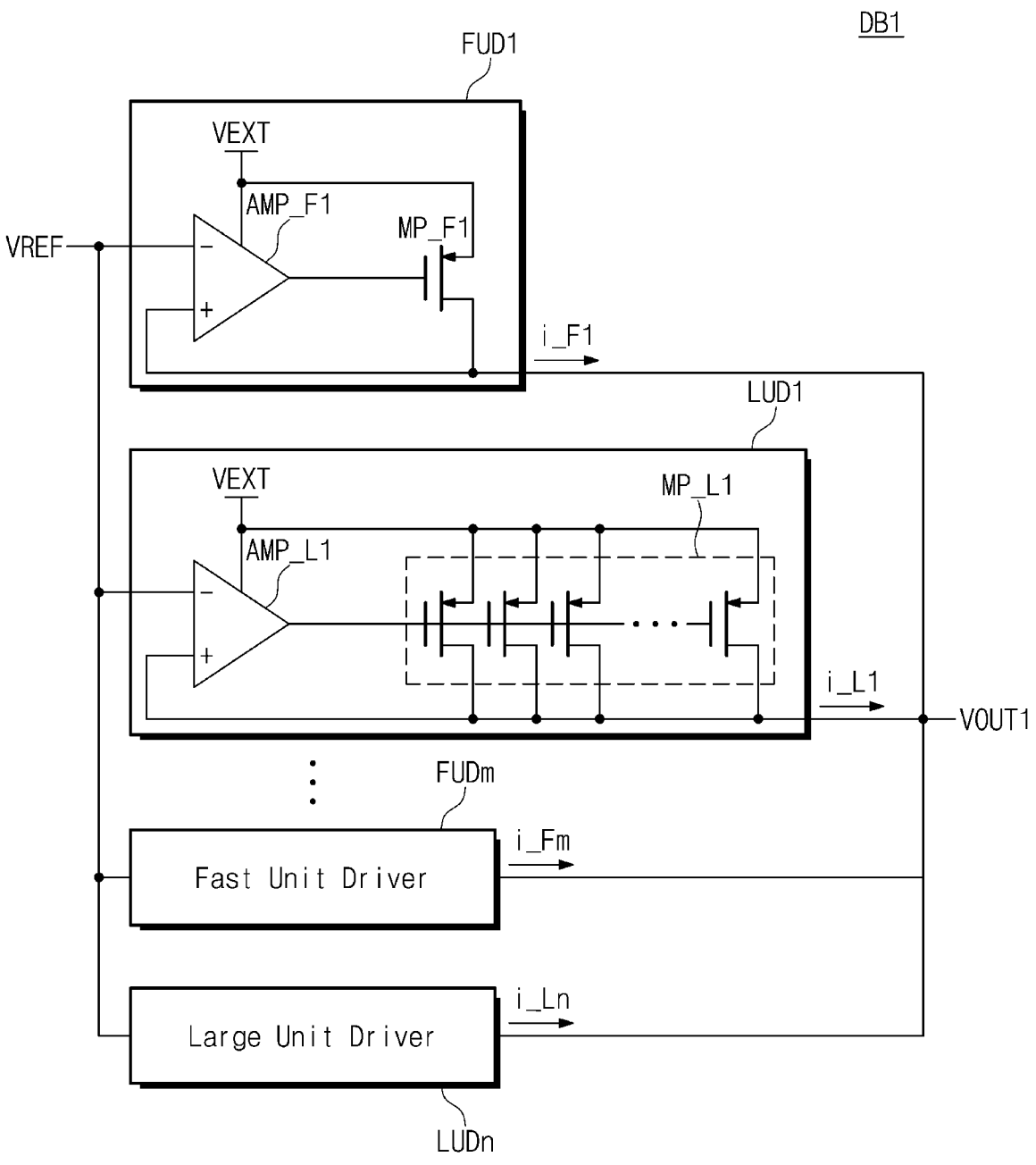
FIG. 5 is a block diagram illustrating a first driving block of FIG. 3 according to example embodiments.

FIG. 5 is a block diagram illustrating a first driving block of FIG. 3 according to example embodiments. For brevity of drawing and for convenience of description, embodiments of the present disclosure will be described with reference to the first driving block DB1, but the present disclosure is not limited thereto. For example, the remaining driving blocks DB2 to DBi may have similar structures.

Referring to FIGS. 1, 3, and 5, the first driving block DB1 may include a plurality of fast unit drivers FUD1 to FUDm (m is a natural number greater than one) and a plurality of large unit drivers LUD1 to LUDn (n is a natural number greater than one). Each of the plurality of fast unit drivers FUD1 to FUDm and the plurality of large unit drivers LUD1 to LUDn may be an LDO circuit configured to stably maintain a first output voltage VOUT1.

For example, the first fast unit driver FUD1 may include a first fast amplifier AMP_F1 and a first fast pass transistor MP_F1. The first fast amplifier AMP_F1 may include an inverting input terminal (−) connected to the reference voltage VREF and a non-inverting input terminal (+) connected to the first output voltage VOUT1. The first fast pass transistor MP_F1 may be a PMOS transistor that is connected between the external voltage VEXT and the first output voltage VOUT1 and is configured to operate in response to an output of the first fast amplifier AMP_F1. For example, the output of the first fast amplifier AMP_F1 may be determined a voltage difference between the reference voltage VREF and the first output voltage VOUT1. Thus, the output of the first fast amplifier AMP_F1 may be referred to as a comparison signal. In an embodiment, each of the remaining fast unit drivers FUD2 to FUDm may be similar in structure to the first fast unit driver FUD1.

The first large unit driver LUD1 may include a first large amplifier AMP_L1 and a first large pass transistor MP_L1. The first large amplifier AMP_L1 may include an inverting input terminal (−) connected to the reference voltage VREF and a non-inverting input terminal (+) connected to the first output voltage VOUT1. The first large pass transistor MP_L1 may be a PMOS transistor that is connected between the external voltage VEXT and the first output voltage VOUT1 and is configured to operate in response to an output of the first large amplifier AMP_L1. In an embodiment, each of the remaining large unit drivers LUD2 to LUDm may be similar in structure to the first large unit driver LUD1.

In an embodiment, the first fast unit driver FUD1 and the first large unit driver LUD1 may have similar structures except that sizes of pass transistors are different. For example, the first fast amplifier AMP_F1 of the first fast unit driver FUD1 and the first large amplifier AMP_L1 the first large amplifier LUD1 may have the same structure, substantially the same size, or substantially the same physical characteristic. In contrast, the first fast pass transistor MP_F1 of the first fast unit driver FUD1 and the first large pass transistor MP_L1 of the first large unit driver LUD1 may have different structure, different size, or different physical characteristic. The size of each of the amplifiers may indicate a W/L (i.e., a ratio between a channel width and a channel length) of each transistor of the amplifiers, and the size of each of the pass transistors may indicate a W/L of each pass transistor or the number of pass transistors each having the same size.

In an embodiment, the size of the first large pass transistor MP_L1 may be larger than the size of the first fast pass transistor MP_F1. That the size of the pass transistor is large means that the magnitude of a current capable of being driven by the pass transistor is large (i.e., the magnitude of a driving current is large).

In detail, the size of the first large pass transistor MP_L1 may be larger than the size of the first fast pass transistor MP_F1. In this case, a current i_L1 that is provided through the first large pass transistor MP_L1 may be greater than a current i_F1 that is provided through the first fast pass transistor MP_F1. For example, the stable supply of the load current may be possible through the large unit drivers LUD1 to LUDn each including the first large pass transistor MP_L1 having a relatively large size.

In contrast, the current i_F1 that is provided through the first fast pass transistor MP_F1 may be smaller than the current i_L1 that is provided through the first large pass transistor MP_L1; however, a response speed of the first fast unit driver FUD1 including the first fast pass transistor MP_F1 may be faster than a response speed of the first large unit driver LUD1 including the first large pass transistor MP_L1. In this case, in a time period where the load current sharply changes, the first fast unit driver FUD1 may quickly cope with a sharp change in the load current.

In an embodiment, a size difference of the first fast pass transistor MP_F1 and the first large pass transistor MP_L1 may be implemented based on various schemes. For example, as illustrated in FIG. 5, the first fast pass transistor MP_F1 may be implemented with a single transistor, and the first large pass transistor MP_L1 may be implemented with a plurality of transistors connected in parallel between the external voltage VEXT and the first output voltage VOUT1. In this case, the first large pass transistor MP_L1 may be configured to drive a larger current compared to the first fast pass transistor MP_F1. Alternatively, each of the first fast pass transistor MP_F1 and the first large pass transistor MP_L1 may be implemented with a single transistor; in this case, the first fast pass transistor MP_F1 and the first large pass transistor MP_L1 may have different physical sizes. For example, the first fast pass transistor MP_F1 and the first large pass transistor MP_L1 may be configured such that the first fast pass transistor MP_F1 has a fast response speed and the first large pass transistor MP_L1 generates a large driving current.

An example in which each of the fast unit drivers FUD1 to FUDm and the large unit drivers LUD1 to LUDn is implemented with a PMOS-type LDO circuit is illustrated, but the present disclosure is not limited thereto. For example, each of the fast unit drivers FUD1 to FUDm and the large unit drivers LUD1 to LUDn may be implemented with an NMOS-type LDO circuit.

Figure 6:
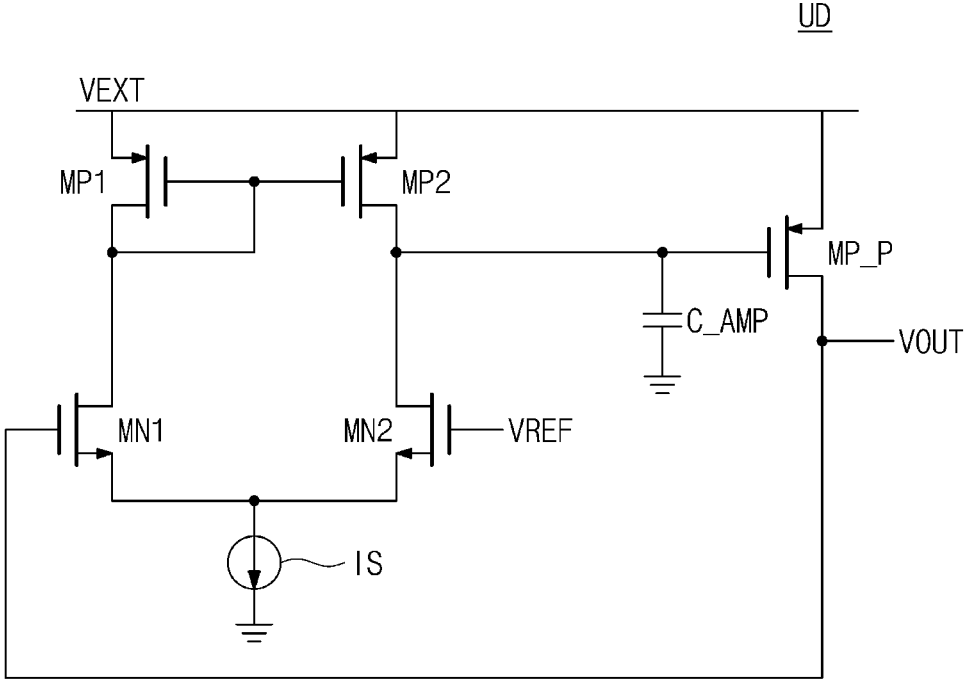
FIG. 6 is a circuit diagram for describing a configuration of a unit driver of FIG. 5 according to example embodiments.

FIG. 6 is a circuit diagram for describing a configuration of a unit driver of FIG. 5 according to example embodiments. In an embodiment, each of the fast unit drivers FUD1 to FUDm and the large unit drivers LUD1 to LUDn of FIG. 5 may be similar in structure to a unit driver UD of FIG. 6 except that sizes (i.e., current driving capabilities) of pass transistors MP_P are different.

Referring to FIGS. 5 and 6, the unit driver UD may include a plurality of transistors MN1, MN2, MP1, MP2, and MP_P and a current source IS.

The first and second PMOS transistors MP1 and MP2, the first and second NMOS transistors MN1 and MN2, and the current source IS may constitute an amplifier AMP. For example, a source of the first PMOS transistor MP1 may be connected to the external voltage VEXT, and a drain and a gate thereof may be connected to a drain of the first NMOS transistor MN1. A source of the first NMOS transistor MN1 may be connected to a source of the second NMOS transistor MN2, and a gate thereof may be connected to the output voltage VOUT. A source of the second PMOS transistor MP2 may be connected to the external voltage VEXT, a gate thereof may be connected to the gate of the first PMOS transistor MP1, and a drain thereof may be connected to a drain of the second NMOS transistor MN2. A gate of the second NMOS transistor MN2 may be connected to the reference voltage VREF. The current source IS may be connected between a connection node of the first and second NMOS transistors MN1 and MN2 and a ground node. In some embodiments, the current source IS may include a driving NMOS transistor. For example, the amplifier AMP may enable by receiving an enable signal through a gate terminal of the driving NMOS transistor. In this case, a logic level of the enable signal may have a logic high level. Alternately, the amplifier AMP may further include a driving PMOS transistor connected to the external voltage VEXT. For example, the amplifier AMP may enable by receiving an enable signal through a gate terminal of the driving PMOS transistor. In this case, a logic level of the enable signal may have a logic low level.

The pass transistor MP_P may be connected between the external voltage VEXT and the output voltage VOUT and may operate in response to a level of a connection node (e.g., an output node of the amplifier AMP) of the second PMOS transistor MP2 and the second NMOS transistor MN2.

In an embodiment, the pass transistor MP_P may correspond to the first fast pass transistor MP_F1 or the first large pass transistor MP_L1 of FIG. 5.

In an embodiment, a response characteristic of the unit driver UD may be determined based on a physical characteristic of the pass transistor MP_P. For example, the response characteristic of the unit driver UD, that is, the speed at which the driving current increases/decreases depending on a change in the load current may be determined by an amplifier capacitor C_AMP. For example, as the amplifier capacitor C_AMP becomes larger, the response speed of the unit driver UD may decrease; as the amplifier capacitor C_AMP becomes smaller, the response speed of the unit driver UD may increase. Herein, the amplifier capacitor C_AMP is a parasitic capacitance but is not a physical (or actual) capacitor intentionally applied. In an embodiment, the amplifier capacitor C_AMP may correspond to a combination of capacitors formed by the plurality of transistors MP1, MP2, MN1, MN2, and MP_P. Assuming that physical characteristics of the first and second PMOS transistors MP1 and MP2 and the first and second NMOS transistors MN1 and MN2 are kept uniformly (i.e., assuming that a size or a driving capability of the amplifier AMP is kept uniformly), the amplifier capacitor C_AMP is determined by the capacitor formed by the pass transistor MP_P. In other words, the amplifier capacitor C_AMP may be depend on the capacitor formed by the pass transistor MP_P.

For example, as the size or driving capability of the pass transistor MP_P increases, the amplifier capacitor C_AMP may become larger; in this case, the response speed of the unit driver UD may become slower. In contrast, as the size or driving capability of the pass transistor MP_P decreases, the amplifier capacitor C_AMP may become smaller; in this case, the response speed of the unit driver UD may become faster.

As described above, according to the present disclosure, the voltage regulator 162 configured to generate the internal voltage IVC and to stabilize the internal voltage IVC may include the plurality of driving blocks DB1 to DBi, and each of the plurality of driving blocks DB1 to DBi may include a fast unit driver and a large unit driver. In this case, the fast unit driver may have a fast response characteristic to a change in the internal voltage IVC (or a change in the load current), and the large unit driver may provide a large load current stably. Accordingly, there is a voltage regulator capable of providing a fast response characteristic and stably supplying a load current without an additional area and additional power consumption.

Figure 7:
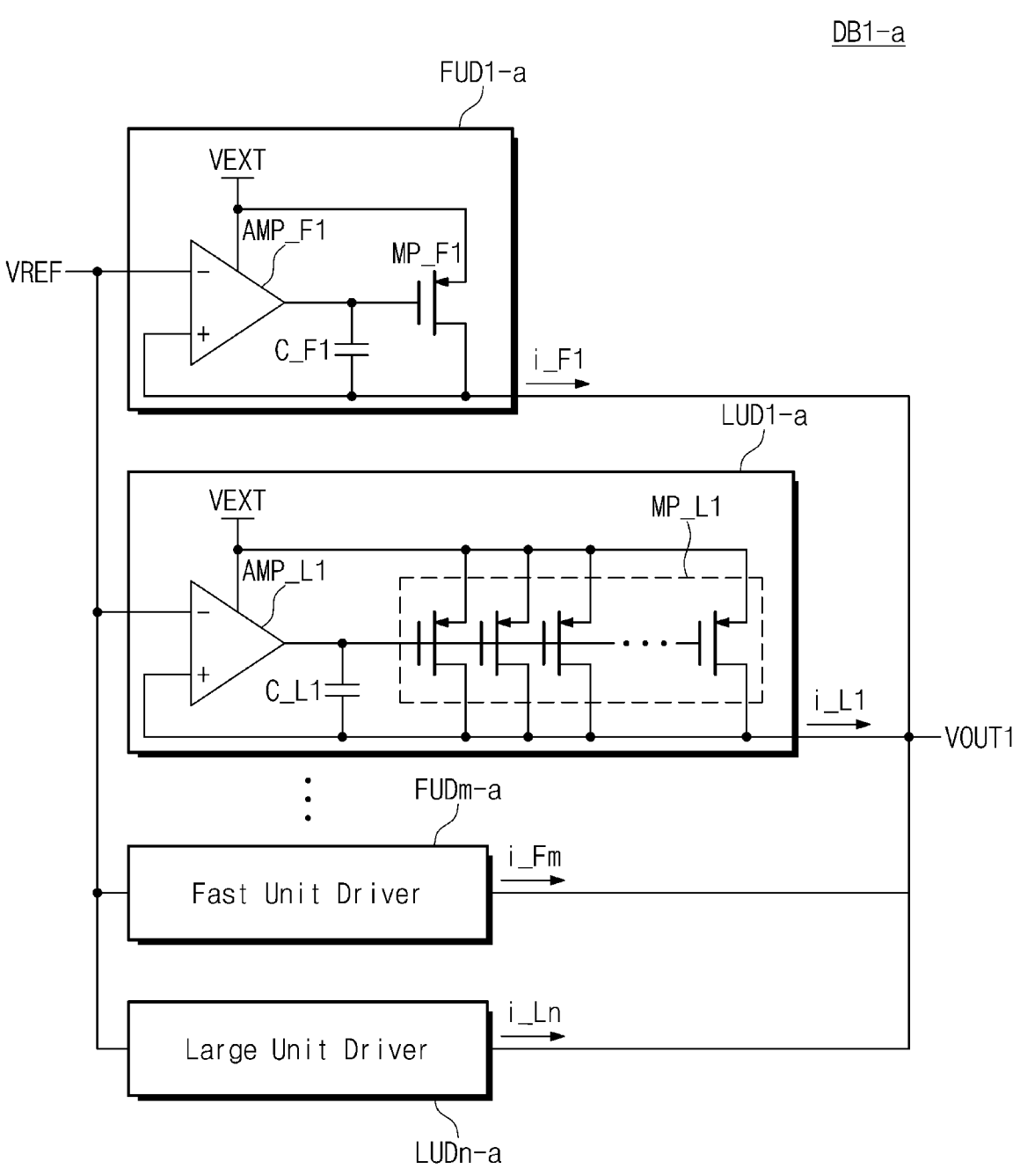
FIG. 7 is a diagram illustrating a first driving block of FIG. 3 according to example embodiments.

FIG. 7 is a diagram illustrating a first driving block of FIG. 3 according to example embodiments. For convenience of description, additional description associated with the components described above will be omitted to avoid redundancy. Referring to FIGS. 3 and 7, a first driving block DB1-*a* may include a plurality of fast unit drivers FUD1-*a* to FUDm-a and a plurality of large unit drivers LUD1-*a* to LUDn-a. Each of the plurality of fast unit drivers FUD1-*a* to FUDm-a and the plurality of large unit drivers LUD1-*a* to LUDn-a may be an LDO circuit configured to stably maintain the first output voltage VOUT1.

An internal configuration of each of the plurality of fast unit drivers FUD1-*a* to FUDm-a and the plurality of large unit drivers LUD1-*a* to LUDn-a may be similar to that described with reference to FIG. 5, and thus, additional description will be omitted to avoid redundancy.

In an embodiment, each of the plurality of fast unit drivers FUD1-*a* to FUDm-a may further include a capacitor C_F1 for frequency compensation, and each of the plurality of large unit drivers LUD1-*a* to LUDn-a may further include a capacitor C_L1 for frequency compensation. For example, the first fast unit driver FUD1-*a* may include the first fast compensation capacitor C_F1 connected between an output terminal and a non-inverting input terminal (+) of the amplifier AMP_F1. The first fast compensation capacitor C_F1 may be a capacitor added for frequency compensation such as Miller compensation.

The first large unit driver LUD1-*a* may include the first large compensation capacitor C_L1 connected between an output terminal and a non-inverting input terminal (+) of the amplifier AMP_L1. The first large compensation capacitor C_L1 may be a capacitor added for frequency compensation such as Miller compensation.

For example, each of the first fast compensation capacitor C_F1 and the first large compensation capacitor C_L1 is an actual capacitor.

In an embodiment, a capacitance value of the first large compensation capacitor C_L1 may be greater than a capacitance value of the first fast compensation capacitor C_F1.

In an embodiment, a first ratio of the first fast compensation capacitor C_F1 to the first large compensation capacitor C_L1 may be identical or proportional to a second ratio of a size of the first fast pass transistor MP_F1 to a size of the first large pass transistor MP_L1.

Figure 8:
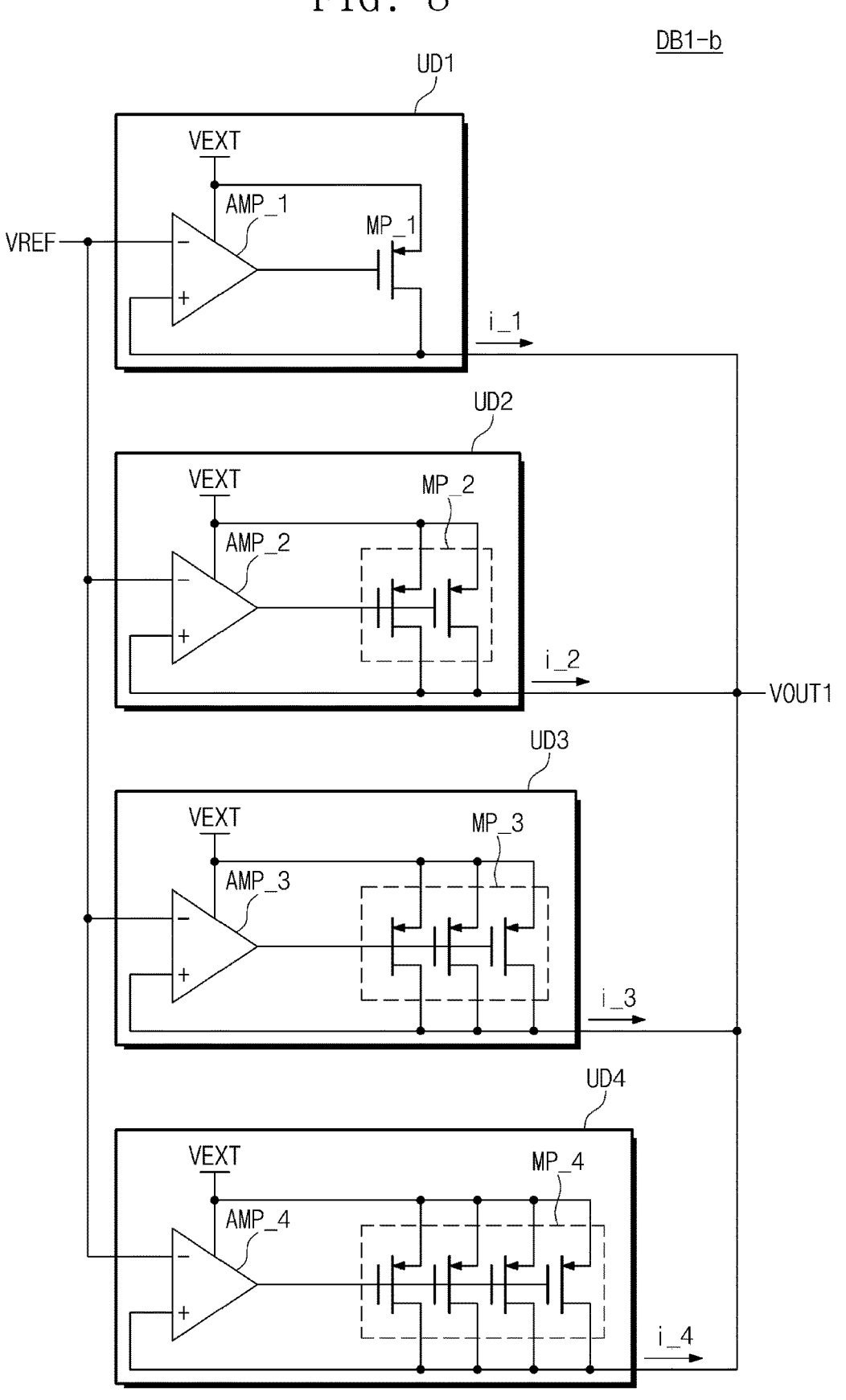
FIG. 8 is a diagram illustrating a first driving block of FIG. 3 according to example embodiments.

FIG. 8 is a diagram illustrating a first driving block of FIG. 3 according to example embodiments. For convenience of description, additional description associated with the components described above will be omitted to avoid redundancy. Referring to FIGS. 3 and 8, a first driving block DB1-*b* may include a plurality of unit drivers UD1 to UD4. Each of the plurality of unit drivers UD1 to UD4 may be an LDO circuit configured to stabilize the first output voltage VOUT1 based on the reference voltage VREF.

For example, the first unit driver UD1 may include a first amplifier AMP_1 and a first pass transistor MP_1 and may output a first current i_1 based on a difference between the first output voltage VOUT1 and the reference voltage VREF. The second unit driver UD2 may include a second amplifier AMP_2 and a second pass transistor MP_2 and may output a second current i_2 based on a difference between the first output voltage VOUT1 and the reference voltage VREF. The third unit driver UD3 may include a third amplifier AMP_3 and a third pass transistor MP_3 and may output a third current i_3 based on a difference between the first output voltage VOUT1 and the reference voltage VREF. The fourth unit driver UD4 may include a fourth amplifier AMP_4 and a fourth pass transistor MP_4 and may output a fourth current i_4 based on a difference between the first output voltage VOUT1 and the reference voltage VREF.

The components included in each of the plurality of unit drivers UD1 to UD4 may constitute a PMOS-type LDO circuit, which is similar to that described above. Thus, additional description will be omitted to avoid redundancy.

In an embodiment, the plurality of pass transistors MP_1 to MP_4 included in the plurality of unit drivers UD1 to UD4 constituting the first driving block DB1-*b* may have different sizes or different driving capabilities. For example, the plurality of unit drivers UD1 to UD4 included in the first driving block DB1-*b* may have different driving capabilities and different response characteristics. In this case, as described above, it may be possible to quickly cope with a change in the load current or a change in the internal voltage by using the first and second unit drivers UD1 and UD2 having a relatively fast response characteristic, and it may be possible to stably supply the load current or the internal voltage by using the third and fourth unit drivers UD3 and UD4 having a relatively great driving capability.

Figure 9:
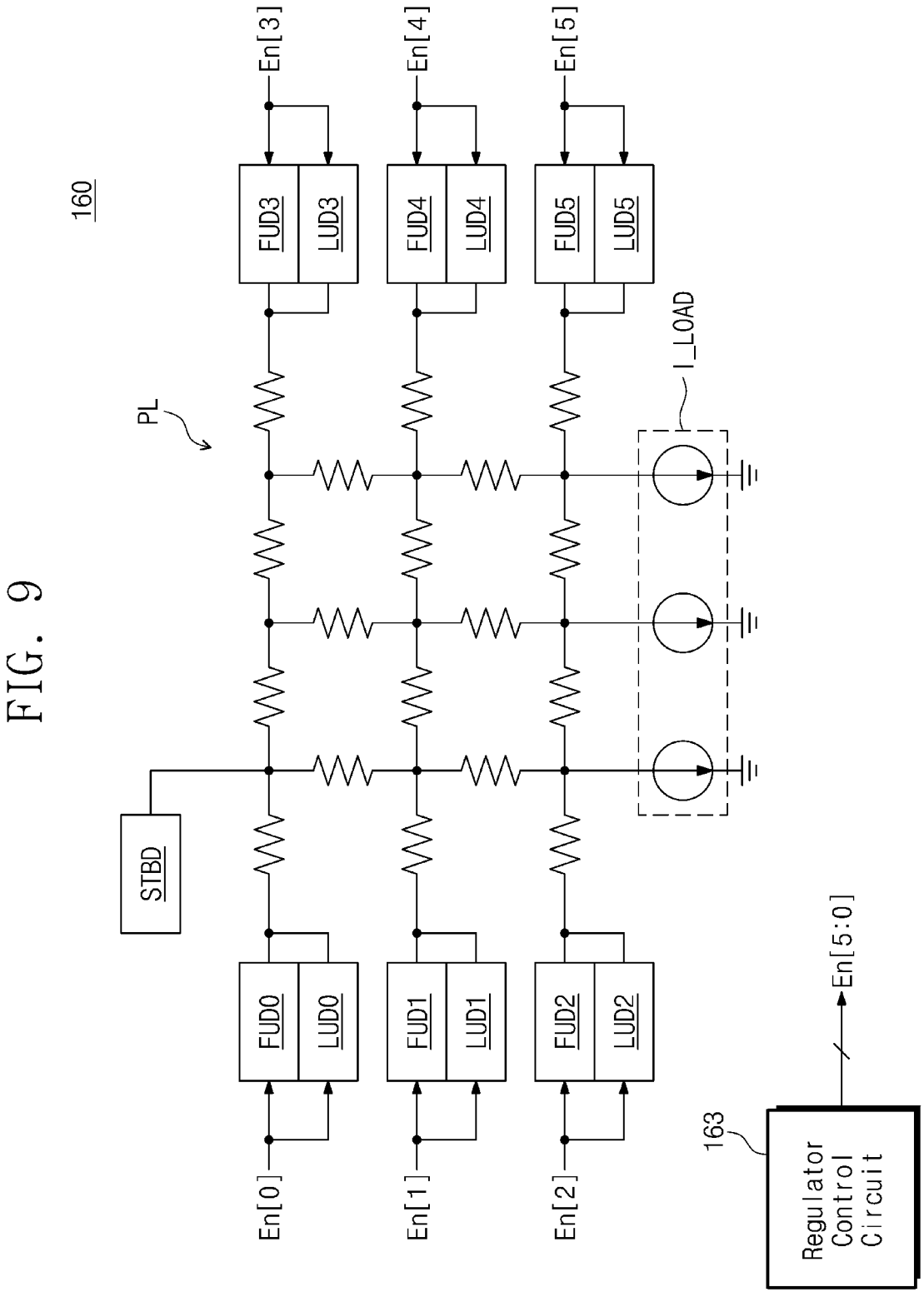
FIG. 9 is a diagram for describing a configuration of a voltage generating circuit of FIG. 1 according to example embodiments.

FIG. 9 is a diagram for describing a configuration of a voltage generating circuit of FIG. 1 according to example embodiments. For convenience of description, it is assumed that the voltage regulator 162 of the voltage generating circuit 160 includes a plurality of fast unit drivers FUD0 to FUD5 and a plurality of large unit drivers LUD0 to LUD5.

Referring to FIGS. 1, 2, and 9, the voltage generating circuit 160 may include the plurality of fast unit drivers FUD0 to FUD5 and the plurality of large unit drivers LUD0 to LUD5. Each of the plurality of fast unit drivers FUD0 to FUD5 and the plurality of large unit drivers LUD0 to LUD5 may be similar in structure to the unit drivers described with reference to FIGS. 5 to 8. For example, each of the plurality of fast unit drivers FUD0 to FUD5 may include a pass transistor having a relatively small size, and each of the plurality of large unit drivers LUD0 to LUD5 may include a pass transistor having a relatively large size. For example, each of the plurality of fast unit drivers FUD0 to FUD5 may drive a relatively small load current but may have a relatively fast response characteristic; each of the plurality of large unit drivers LUD0 to LUD5 may drive a relatively large load current but may have a relatively slow response characteristic.

The plurality of fast unit drivers FUD0 to FUD5 and the plurality of large unit drivers LUD0 to LUD5 may be connected to a power line PL. The power line PL may be a conductive line for providing the internal voltage IVC to various components of the memory device 100. A driving current I_LOAD may flow through the power line PL depending on operations of the components in the memory device 100.

In an embodiment, the plurality of fast unit drivers FUD0 to FUD5 and the plurality of large unit drivers LUD0 to LUD5 may operate in response to a control signal En[5:0]. For example, the 0-th fast unit driver FUD0 and the 0-th large unit driver LUD0 may be enabled in response to the 0-th control signal En[0]. The first fast unit driver FUD1 and the first large unit driver LUD1 may be enabled in response to the first control signal En[1]. The second fast unit driver FUD2 and the second large unit driver LUD2 may be enabled in response to the second control signal En[2]. The third fast unit driver FUD3 and the third large unit driver LUD3 may be enabled in response to the third control signal En[3]. The fourth fast unit driver FUD4 and the fourth large unit driver LUD4 may be enabled in response to the fourth control signal En[4]. The fifth fast unit driver FUD5 and the fifth large unit driver LUD5 may be enabled in response to the fifth control signal En[5]. In an embodiment, a regulator control circuit 163 may generate the control signal En[5:0] based on the driving current I_LOAD or a level of the internal voltage IVC. For example, in the voltage generating circuit 160, the driving current I_LOAD or the level of the internal voltage IVC is monitored and the regulator control circuit 163 may generate the control signal En[5:0] based on the monitored driving current or the internal voltage.

In an embodiment, the voltage generating circuit 160 may further include a standby driver STBD. The standby driver STBD may be connected to the power line PL providing the internal voltage IVC. The standby driver STBD may be configured to stabilize the internal voltage IVC of the power line PL in an idle period of the memory device 100 (i.e., in a period where the memory device 100 does not perform a separate operation or when the load current I_LOAD is smaller than or equal to a reference value). In an embodiment, the standby driver STBD may have a low driving capability and a slow response characteristic compared to the plurality of fast unit drivers FUD0 to FUD5 and the plurality of large unit drivers LUD0 to LUD5. For example, the standby driver STBD may be an LDO circuit including a relatively small size or a relatively small driving capability, compared to the plurality of fast unit drivers FUD0 to FUD5 and the plurality of large unit drivers LUD0 to LUD5.

In some embodiments, the standby driver STBD may have a similar structure to each of the plurality of fast unit drivers FUD0 to FUD5 and the plurality of large unit drivers LUD0 to LUD5 except that a size of an amplifier of the standby driver STBD is different from a size of the amplifier of each of the plurality of fast unit drivers FUD0 to FUD5 and the plurality of large unit drivers LUD0 to LUD5. For example, a driving capability of the amplifier of the standby driver STBD may be less than a driving capability of each amplifier of the plurality of fast unit drivers FUD0 to FUD5 and the plurality of large unit drivers LUD0 to LUD5.

For example, the standby driver STBD may be an LDO circuit for maintaining the load current I_LOAD or the internal voltage IVC in a standby state during the idle period of the memory device 100. Each of the plurality of fast unit drivers FUD0 to FUD5 and each of the plurality of large unit drivers LUD0 to LUD5 may be a LDO circuit for maintaining the load current I_LOAD or the internal voltage IVC at a target level while the memory device 100 is driven.

Figure 10:
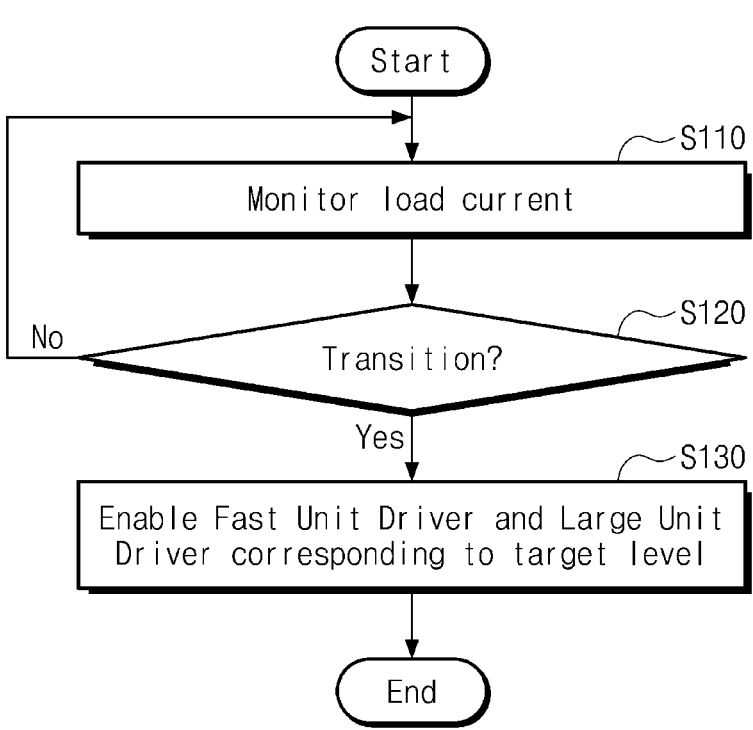
FIG. 10 is a flowchart illustrating an operation of a voltage generating circuit of FIG. 9 according to example embodiments.

FIG. 10 is a flowchart illustrating an operation of a voltage generating circuit of FIG. 9 according to example embodiments. Referring to FIGS. 1, 9, and 10, in operation S110, the voltage generating circuit 160 may monitor the load current. In operation S120, the voltage generating circuit 160 may determine whether the load current I_LOAD transitions.

For example, the voltage generating circuit 160 may be configured to monitor the load current I_LOAD flowing to the power line PL to which the internal voltage IVC is provided. When power consumption by components of the memory device 100 using the internal voltage IVC in the operation of the memory device 100 increases, the load current I_LOAD may increase. In this case, the voltage generating circuit 160 may determine that the load current I_LOAD transitions.

When it is determined that the load current I_LOAD transitions, in operation S130, the voltage generating circuit 160 may enable fast unit drivers and large unit drivers corresponding to a target level of the load current I_LOAD. In this case, the load current I_LOAD may quickly increase to the target level by the fast unit drivers (i.e., the response speed may become faster), and the load current I_LOAD of the target level may be stably provided by the large unit drivers.

In an embodiment, an example in which the voltage generating circuit 160 monitors the load current I_LOAD is described in the flowchart of FIG. 10, but the present disclosure is not limited thereto. For example, the voltage generating circuit 160 may monitor the level of the internal voltage IVC. When the load current I_LOAD increases due to the operation of the memory device 100, the internal voltage IVC may decrease. For example, when the internal voltage IVC decreases to a threshold value or less, the voltage generating circuit 160 may enable the fast unit drivers and the large unit drivers.

Alternatively, the regulator control circuit 163 may operate under control of the control logic circuit 130 of FIG. 1 instead of monitoring the load current I_LOAD or the internal voltage IVC by the voltage generating circuit 160. For example, the internal voltage IVC or the load current I_LOAD may change depending on an operating state of the memory device 100. The operation of the memory device 100 may be overall performed under control of the control logic circuit 130. For example, in the operation of the memory device 100 causing an increase in power consumption, the control logic circuit 130 may enable the fast unit drivers and the large unit drivers of the voltage generating circuit 160.

Figure 11:
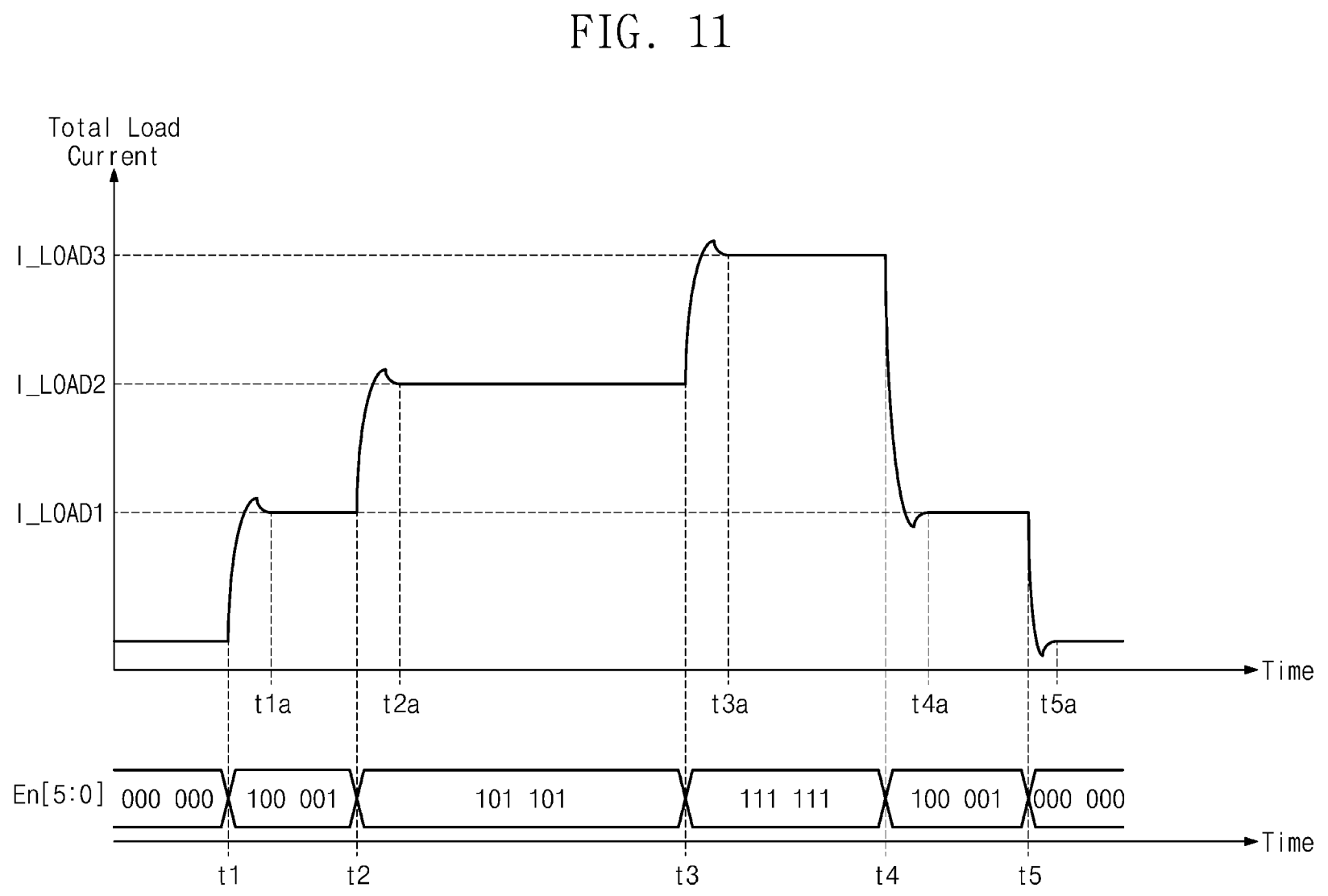

FIG. 11 is a diagram for describing an operation according to the flowchart of FIG. 10 according to example embodiments. In a graph of FIG. 11, a horizontal axis represents a time, and a vertical axis represents a level of the load current I_LOAD. For convenience of description, a configuration in which the load current I_LOAD gradually increases while the memory device 100 operates will be described, but the present disclosure is not limited thereto. The load current I_LOAD may variously change depending on an operating state or an operating step of the memory device 100.

Referring to FIGS. 1 and 9 to 11, depending on the operation of the memory device 100, the load current I_LOAD may start to increase to a first load current I_LOAD1 at a time point t1. In this case, the regulator control circuit 163 may output [100 001] as the control signal En[5:0] at the time point t1. Hereinafter, it is assumed that each amplifier of unit drivers may include a driving NMOS transistor. In response to the control signal En[5:0] being [100 001], the 0-th and fifth fast unit drivers FUD0 and FUD5 and the 0-th and fifth large unit drivers LUD0 and LUD5 may be enabled. As such, the load current I_LOAD may increase to the first load current I_LOAD1. In an embodiment, a time period from t1 to t1a may be a time period during which the load current I_LOAD transitions to the first load current I_LOAD1. In the time period from t1 to t1a, the load current I_LOAD may quickly increase to the first load current I_LOAD1 by the 0-th and fifth fast unit drivers FUD0 and FUD5 thus enabled (i.e., a response speed being fast). After the time point t1a, the load current I_LOAD may be stably maintained at the first load current I_LOAD1 by the 0-th and fifth large unit drivers LUD0 and LUD5 thus enabled.

Likewise, at a time point t2, the load current I_LOAD may start to increase to a second load current I_LOAD2 depending on the operation of the memory device 100. In this case, the regulator control circuit 163 may output [101 101] as the control signal En[5:0] at the time point t2. In response to the control signal En[5:0] being [101 101], the 0-th, second, third, and fifth fast unit drivers FUD0, FUD2, FUD3, and FUD5 and the 0-th, second, third, and fifth large unit drivers LUD0, LUD2, LUD3, and LUD5 may be enabled. As such, the load current I_LOAD may increase to the second load current I_LOAD2. In an embodiment, a time period from t2 to t2a may be a time period during which the load current I_LOAD transitions to the second load current I_LOAD2. In the time period from t2 to t2a, the load current I_LOAD may quickly increase to the second load current I_LOAD2 by the 0-th, second, third, and fifth fast unit drivers FUD0, FUD2, FUD3, and FUD5 thus enabled (i.e., a response speed being fast). After the time point t2a, the load current I_LOAD may be stably maintained at the second load current I_LOAD2 by the 0-th, second, third, and fifth large unit drivers LUD0, LUD2, LUD3, and LUD5 thus enabled.

Likewise, at a time point t3, the load current I_LOAD may start to increase to a third load current I_LOAD3 depending on the operation of the memory device 100. In this case, the regulator control circuit 163 may output [111 111] as the control signal En[5:0] at the time point t3. In response to the control signal En[5:0] being [111 111], the 0-th to fifth fast unit drivers FUD0 to FUD5 and the 0-th to fifth large unit drivers LUD0 to LUD5 may be enabled. As such, the load current I_LOAD may increase to the third load current I_LOAD3. In an embodiment, a time period from t3 to t3a may be a time period during which the load current I_LOAD transitions to the third load current I_LOAD3. In the time period from t3 to t3a, the load current I_LOAD may quickly increase to the third load current I_LOAD3 by the 0-th to fifth fast unit drivers FUD0 to FUD5 thus enabled (i.e., a response speed being fast). After the time point t3a, the load current I_LOAD may be stably maintained at the third load current I_LOAD3 by the 0-th to fifth large unit drivers LUD0 to LUD5 thus enabled.

Afterwards, at a time point t4, the load current I_LOAD may start to decrease to the first load current I_LOAD1; in this case, the regulator control circuit 163 may output the control signal En[5:0] being [100 001]. In response to the control signal En[5:0] being [100 001], the 0-th and fifth fast unit drivers FUD0 and FUD5 and the 0-th and fifth large unit drivers LUD0 and LUD5 may be enabled. As such, the load current I_LOAD may decrease to the first load current I_LOAD1. In an embodiment, a time period from t4 to t4a may be a time period during which the load current I_LOAD transitions to the first load current I_LOAD1. In the time period from t4 to t4a, the load current I_LOAD may quickly decrease to the first load current I_LOAD1 by the 0-th and fifth fast unit drivers FUD0 and FUD5 thus enabled (i.e., a response speed being fast). After the time point t4a, the load current I_LOAD may be stably maintained at the first load current I_LOAD1 by the 0-th and fifth large unit drivers LUD0 and LUD5 thus enabled.

Afterwards, at a time point t5, the load current I_LOAD may start to decrease to a standby current state; in this case, the regulator control circuit 163 may output the control signal En[5:0] being [000 000]. In response to the control signal En[5:0] being [000 000], the 0-th to fifth fast unit drivers FUD0 to FUD5 and the 0-th to fifth large unit drivers LUD0 to LUD5 may be disabled. In this case, the load current I_LOAD may be maintained in the standby current state by the standby driver STBD.

As described above, a fast unit driver and a large unit driver of the voltage generating circuit 160 may be selectively enabled depending on the operating state or the load current I_LOAD of the memory device 100. In this case, in the transition period of the load current I_LOAD, the load current I_LOAD may quickly increase/decrease to the target level by the fast unit driver, and the load current I_LOAD may be stably maintained by the large unit driver.

Figure 12:
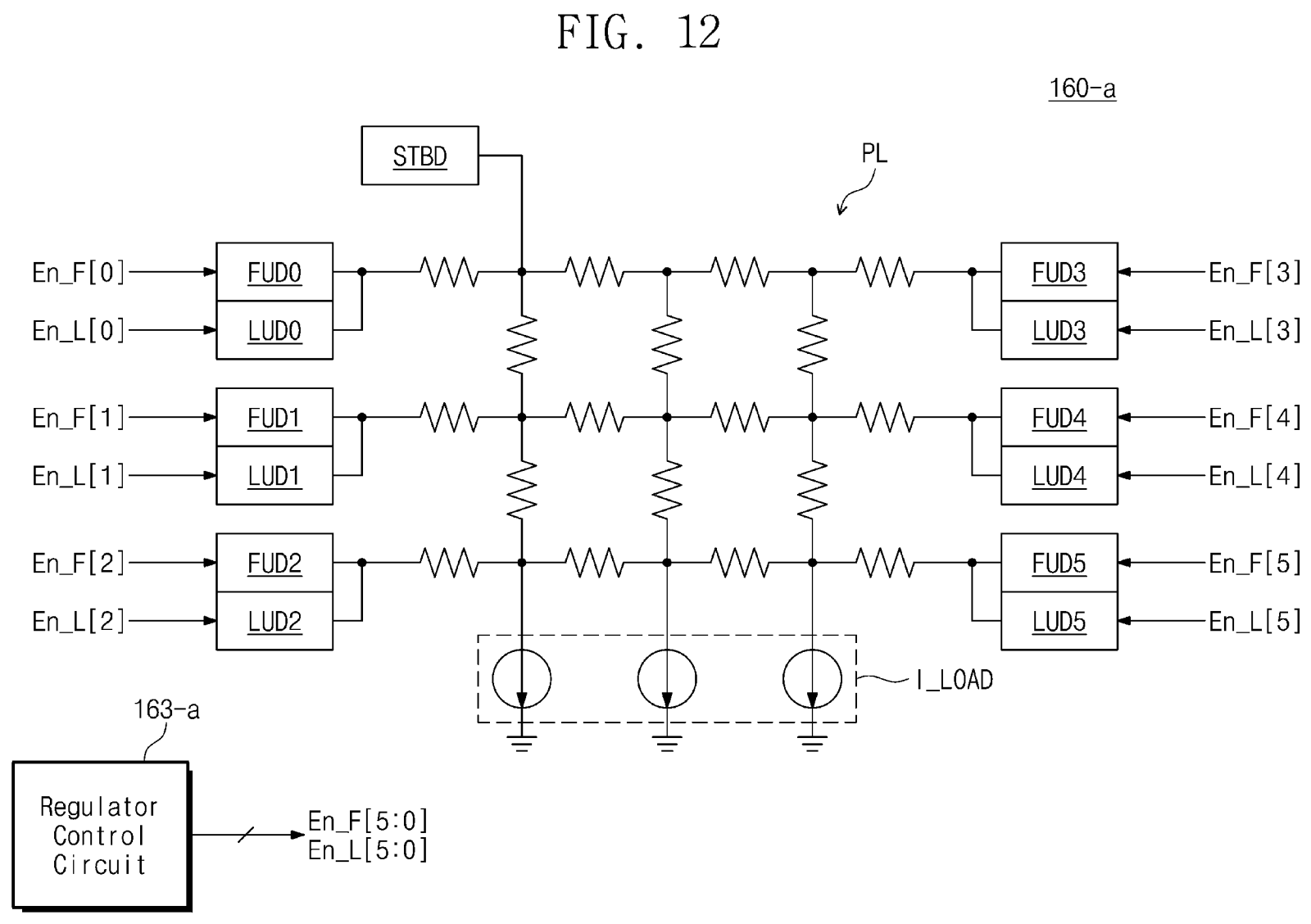

FIG. 12 is a diagram for describing a configuration of a voltage generating circuit of FIG. 1 according to example embodiments. Referring to FIGS. 1, 2, and 12, a voltage generating circuit 160-a may include a plurality of fast unit drivers FUD0 to FUD5, a plurality of large unit drivers LUD0 to LUD5, and a standby driver STBD. Each of the plurality of fast unit drivers FUD0 to FUD5 and the plurality of large unit drivers LUD0 to LUD5 may be similar in structure to the unit drivers described with reference to FIGS. 5 to 8. The plurality of fast unit drivers FUD0 to FUD5, the plurality of large unit drivers LUD0 to LUD5, and the standby driver STBD may be connected to the power line PL configured to provide the internal voltage IVC. Configurations of the plurality of fast unit drivers FUD0 to FUD5, the plurality of large unit drivers LUD0 to LUD5, and the standby driver STBD are similar to those described with reference to FIG. 9, and thus, additional description will be omitted to avoid redundancy.

In an embodiment, the plurality of fast unit drivers FUD0 to FUD5 and the plurality of large unit drivers LUD0 to LUD5 may be controlled independently of each other. For example, a regulator control circuit 163-a may generate a fast control signal En_F[5:0] and a large control signal En_L[5:0]. The plurality of fast unit drivers FUD0 to FUD5 may operate in response to the fast control signal En_F[5:0], respectively, and the plurality of large unit drivers LUD0 to LUD5 may operate in response to the large control signal En_L[5:0], respectively.

Figure 13:
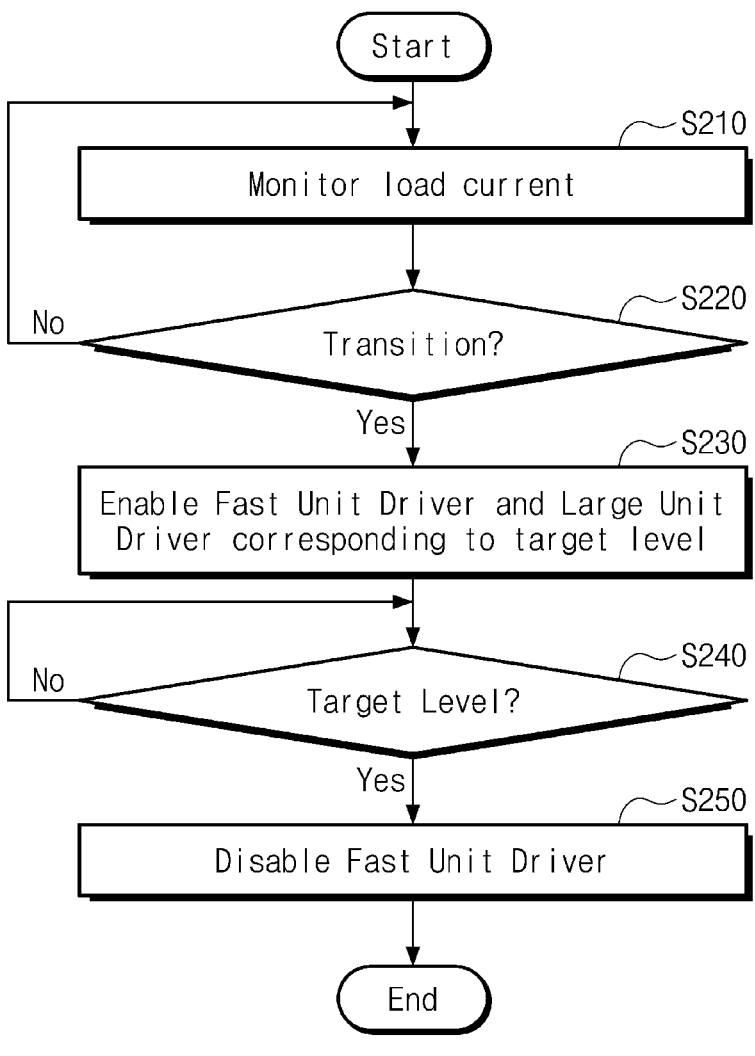
FIG. 13 is a flowchart illustrating an operation of a voltage generating circuit of FIG. 12 according to example embodiments.

FIG. 13 is a flowchart illustrating an operation of a voltage generating circuit of FIG. 12 according to example embodiments. Referring to FIGS. 1, 12, and 13, the voltage generating circuit 160-a may perform operation S210 to operation S230. Operation S210 to operation S230 are similar to operation S110 to operation S130 of FIG. 10, and thus, additional description will be omitted to avoid redundancy.

After operation S230, in operation S240, the voltage generating circuit 160-a may determine whether the load current I_LOAD reaches a target level. When it is determined that the load current I_LOAD reaches the target level, the voltage generating circuit 160-a may disable the fast unit driver. For example, in the transition period in which the load current I_LOAD increases or decreases, the voltage generating circuit 160-a may enable the fast unit driver such that the load current I_LOAD quickly reaches the target level.

In an embodiment, the voltage generating circuit 160-a may determine whether the internal voltage IVC reaches a target level. When the internal voltage IVC reaches the target level, the voltage generating circuit 160-a may disable the fast unit driver. Alternatively, the control logic circuit 130 may be configured to enable the fast unit driver during a given time depending on the operating state of the memory device 100 (e.g., when the operating mode changes or the operating state changes). For example, the control logic circuit 130 may control the voltage generating circuit 160-a such that the fast unit driver is disabled after the given time.

Figure 14:
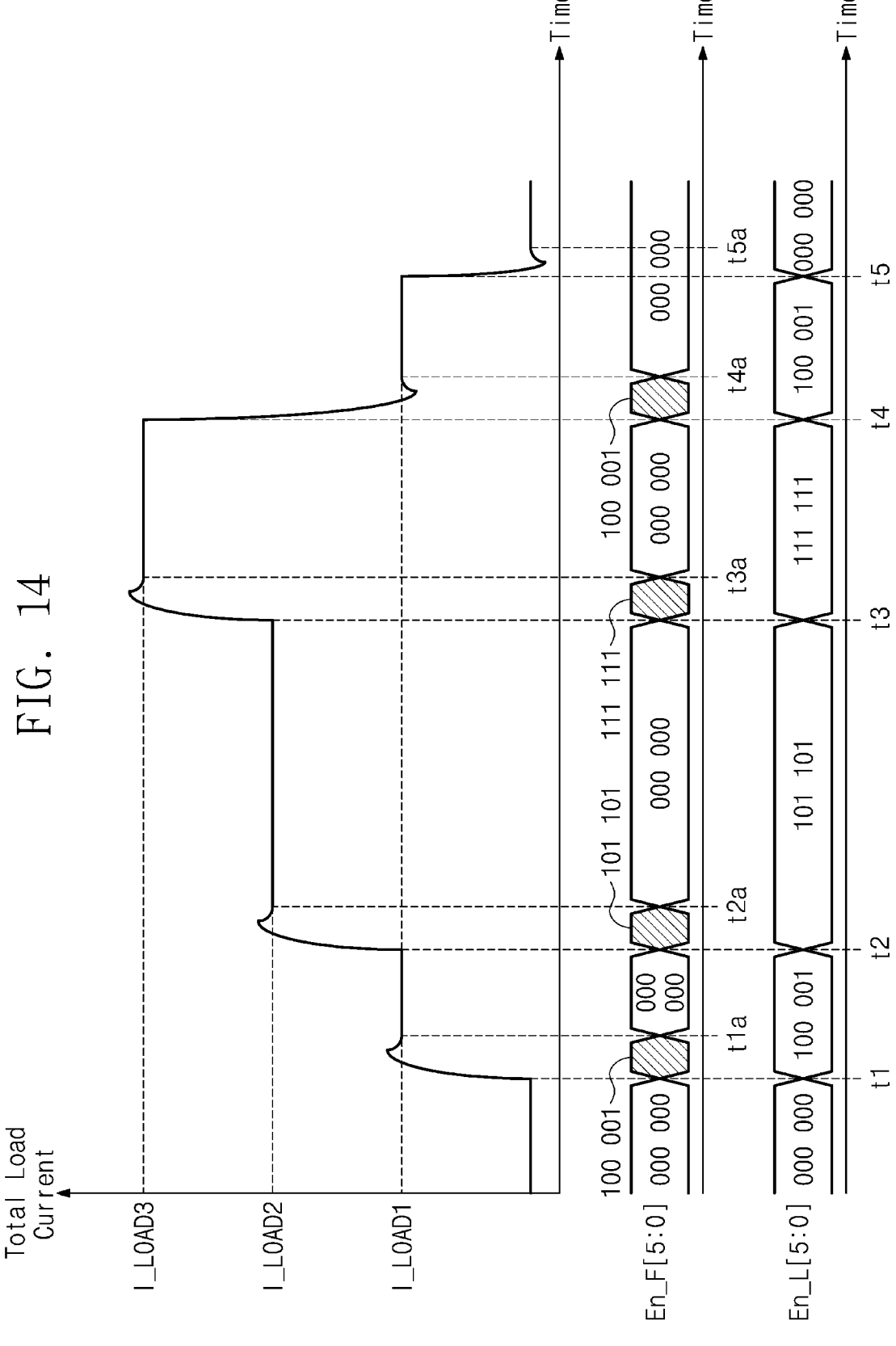
FIG. 14 is a diagram for describing an operation according to the flowchart of FIG. 13 according to example embodiments.

FIG. 14 is a diagram for describing an operation according to the flowchart of FIG. 13 according to example embodiments. In a graph of FIG. 14, a horizontal axis represents a time, and a vertical axis represents a load current. Referring to FIGS. 1 and 12 to 14, the load current I_LOAD may start to increase to the first load current I_LOAD1 at a time point t1, may start to increase to the second load current I_LOAD2 at a time point t2, may start to increase to the third load current I_LOAD3 at a time point t3, may start to decrease to the first load current I_LOAD1 at a time point t4, and may start to decrease to a standby current state at a time point t5.

As in the above control signal En[5:0] described with reference to FIG. 11, the regulator control circuit 163-*a* may generate the large control signal En_L[5:0]. For example, at the time point t1, the regulator control circuit 163-*a* may output [100 001] as the large control signal En_L[5:0]; in this case, the 0-th and fifth large unit drivers LUD0 and LUD5 may be enabled, and the first load current I_LOAD1 may be stably provided by the 0-th and fifth large unit drivers LUD0 and LUD5 thus enabled.

At the time point t2, the regulator control circuit 163-*a* may output [101 101] as the large control signal En_L[5:0]; in this case, the 0-th, second, third, and fifth large unit drivers LUD0, LUD2, LUD3, and LUD5 may be enabled, and the second load current I_LOAD2 may be stably provided by the 0-th, second, third, and fifth large unit drivers LUD0, LUD2, LUD3, and LUD5 thus enabled.

At the time point t3, the regulator control circuit 163-*a* may output [111 111] as the large control signal En_L[5:0]; in this case, the 0-th to fifth large unit drivers LUD0 to LUD5 may be enabled, and the third load current I_LOAD3 may be stably provided by the 0-th to fifth large unit drivers LUD0 to LUD5 thus enabled.

At the time point t4, the regulator control circuit 163-*a* may output [100 001] as the large control signal En_L[5:0]; in this case, the 0-th and fifth large unit drivers LUD0 and LUD5 may be enabled, and the first load current I_LOAD1 may be stably provided by the 0-th and fifth large unit drivers LUD0 and LUD5 thus enabled.

At the time point t5, the regulator control circuit 163-*a* may output [000 000] as the large control signal En_L[5:0]; in this case, all of the 0-th to fifth large unit drivers LUD0 to LUD5 may be disabled, the load current I_LOAD may be maintained in the standby current state by the standby driver STBD.

In an embodiment, a corresponding fast unit driver may be enabled in a period where the load current I_LOAD transitions. For example, a time period from t1 to t1*a* may be a transition period during which the load current I_LOAD transitions to the first load current I_LOAD1. In this case, the regulator control circuit 163-*a* may output [100 001] as the fast control signal En_F[5:0]; in this case, the 0-th and fifth fast unit drivers FUD0 and FUD5 may be enabled. The load current I_LOAD may quickly increase to the first load current I_LOAD1 by the 0-th and fifth fast unit drivers FUD0 and FUD5 thus enabled. In an embodiment, after the transition period (i.e., after the time point t1*a*), the regulator control circuit 163-*a* may output [000 000] as the fast control signal En_F[5:0]. As such, the fast unit drivers FUD0 to FUD5 may be disabled. For example, the fast unit drivers FUD0 to FUD5 may be controlled to be enabled in the transition period of the load current I_LOAD.

Likewise, the regulator control circuit 163-*a* may output [101 101] as the fast control signal En_F[5:0] in a transition period from t2 to t2*a*; the regulator control circuit 163-*a* may output [111 111] as the fast control signal En_F[5:0] in a transition period from t3 to t3*a*; the regulator control circuit 163-*a* may output [100 001] as the fast control signal En_F[5:0] in a transition period from t4 to t4*a*. In each transition period, each of the fast unit drivers FUD0 to FUD5 may be selectively enabled depending on the fast control signal En_F[5:0].

In an embodiment, the number of fast unit drivers activated from among the fast unit drivers FUD0 to FUD5 and the number of large unit drivers activated from among the large unit drivers LUD0 to LUD5 may be determined depending on the target level of the load current I_LOAD.

As described above, the voltage generating circuit 160 or 160-*a* according to the present disclosure may generate the internal voltage IVC used in the memory device 100 by using a plurality of unit drivers. In this case, some of the plurality of unit drivers may be implemented with a fast unit driver having a fast response speed to a change in a load current or a change in an internal voltage, and the others thereof may be implemented with a large unit driver configured to provide a large load current. According to the above description, a response to the change in the load current or the change in the internal voltage is possible through the fast unit driver, and the stable supply of the load current is possible through the large unit driver. This may make it possible to supply the internal voltage stably without an additional bias circuit or an additional unit driver. Accordingly, a memory device with improved performance and improved reliability is provided.

Figure 15:
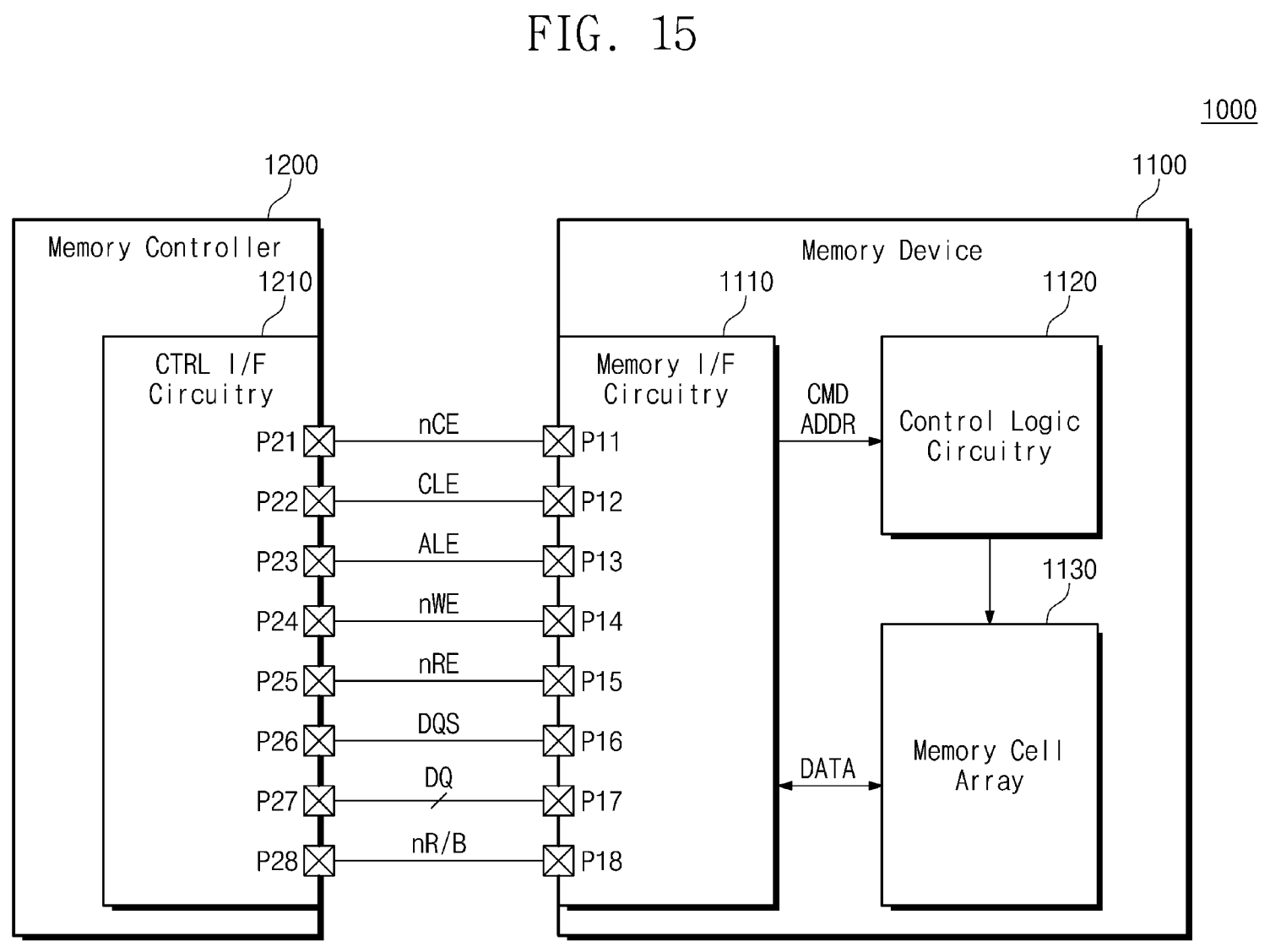

FIG. 15 is a block diagram of a memory system according to an embodiment. Referring to FIG. 15, a memory system 1000 may include a memory device 1100 and a memory controller 1200.

The memory device 1100 may include first to eighth pins P11 to P18, a memory interface circuitry 1110, a control logic circuitry 1120, and a memory cell array 1130.

The memory interface circuitry 1110 may receive a chip enable signal nCE from the memory controller 1200 through the first pin P11. The memory interface circuitry 1110 may transmit and receive signals to and from the memory controller 1200 through the second to eighth pins P12 to P18 in response to the chip enable signal nCE. For example, when the chip enable signal nCE is in an enable state (e.g., a low level), the memory interface circuitry 1110 may transmit and receive signals to and from the memory controller 1200 through the second to eighth pins P12 to P18.

The memory interface circuitry 1110 may receive a command latch enable signal CLE, an address latch enable signal ALE, and a write enable signal nWE from the memory controller 1200 through the second to fourth pins P12 to P14. The memory interface circuitry 1110 may receive a data signal DQ from the memory controller 1200 through the seventh pin P17 or transmit the data signal DQ to the memory controller 1200. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 1110 may obtain the command CMD from the data signal DQ, which is received in an enable section (e.g., a high-level state) of the command latch enable signal CLE based on toggle time points of the write enable signal nWE. The memory interface circuitry 1110 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 1110 may obtain the command CMD or the address ADDR based on toggle time points of the write enable signal nWE.

The memory interface circuitry 1110 may receive a read enable signal nRE from the memory controller 1200 through the fifth pin P15. The memory interface circuitry 1110 may receive a data strobe signal DQS from the memory controller 1200 through the sixth pin P16 or transmit the data strobe signal DQS to the memory controller 1200.

In a data (DATA) output operation (e.g., read operation) of the memory device 1100, the memory interface circuitry 1110 may receive the read enable signal nRE, which toggles through the fifth pin P15, before outputting the data DATA. The memory interface circuitry 1110 may generate the data strobe signal DQS, which toggles based on the toggling of the read enable signal nRE. For example, the memory interface circuitry 1110 may generate a data strobe signal DQS, which starts toggling after a predetermined delay (e.g., tDQSRE), based on a toggling start time of the read enable signal nRE. The memory interface circuitry 1110 may transmit the data signal DQ including the data DATA based on a toggle time point of the data strobe signal DQS. Thus, the data DATA may be aligned with the toggle time point of the data strobe signal DQS and transmitted to the memory controller 1200.

In a data (DATA) input operation (e.g., write or program operation) of the memory device 1100, when the data signal DQ including the data DATA is received from the memory controller 1200, the memory interface circuitry 1110 may receive the data strobe signal DQS, which toggles, along with the data DATA from the memory controller 1200. The memory interface circuitry 1110 may obtain the data DATA from the data signal DQ based on toggle time points of the data strobe signal DQS. For example, the memory interface circuitry 1110 may sample the data signal DQ at rising and falling edges of the data strobe signal DQS and obtain the data DATA.

The memory interface circuitry 1110 may transmit a ready/busy output signal nR/B to the memory controller 1200 through the eighth pin P18. The memory interface circuitry 1110 may transmit state information of the memory device 1100 through the ready/busy output signal nR/B to the memory controller 1200. When the memory device 1100 is in a busy state (i.e., when operations are being performed in the memory device 1100), the memory interface circuitry 1110 may transmit a ready/busy output signal nR/B indicating the busy state to the memory controller 1200. When the memory device 1100 is in a ready state (i.e., when operations are not performed or completed in the memory device 1100), the memory interface circuitry 1110 may transmit a ready/busy output signal nR/B indicating the ready state to the memory controller 1200. For example, while the memory device 1100 is reading data DATA from the memory cell array 1130 in response to a page read command, the memory interface circuitry 1110 may transmit a ready/busy output signal nR/B indicating a busy state (e.g., a low level) to the memory controller 1200. For example, while the memory device 1100 is programming data DATA to the memory cell array 1130 in response to a program command, the memory interface circuitry 1110 may transmit a ready/busy output signal nR/B indicating the busy state to the memory controller 1200.

The control logic circuitry 1120 may control all operations of the memory device 1100. The control logic circuitry 1120 may receive the command/address CMD/ADDR obtained from the memory interface circuitry 1110. The control logic circuitry 1120 may generate control signals for controlling other components of the memory device 1100 in response to the received command/address CMD/ADDR. For example, the control logic circuitry 1120 may generate various control signals for programming data DATA to the memory cell array 1130 or reading the data DATA from the memory cell array 1130.

The memory cell array 1130 may store the data DATA obtained from the memory interface circuitry 1110, via the control of the control logic circuitry 1120. The memory cell array 1130 may output the stored data DATA to the memory interface circuitry 1110 via the control of the control logic circuitry 1120.

The memory cell array 1130 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 1200 may include first to eighth pins P21 to P28 and a controller interface circuitry 1210. The first to eighth pins P21 to P28 may respectively correspond to the first to eighth pins P11 to P18 of the memory device 1100.

The controller interface circuitry 1210 may transmit a chip enable signal nCE to the memory device 1100 through the first pin P21. The controller interface circuitry 1210 may transmit and receive signals to and from the memory device 1100, which is selected by the chip enable signal nCE, through the second to eighth pins P22 to P28.

The controller interface circuitry 1210 may transmit the command latch enable signal CLE, the address latch enable signal ALE, and the write enable signal nWE to the memory device 1100 through the second to fourth pins P22 to P24. The controller interface circuitry 1210 may transmit or receive the data signal DQ to and from the memory device 1100 through the seventh pin P27.

The controller interface circuitry 1210 may transmit the data signal DQ including the command CMD or the address ADDR to the memory device 1100 along with the write enable signal nWE, which toggles. The controller interface circuitry 1210 may transmit the data signal DQ including the command CMD to the memory device 1100 by transmitting a command latch enable signal CLE having an enable state. Also, the controller interface circuitry 1210 may transmit the data signal DQ including the address ADDR to the memory device 1100 by transmitting an address latch enable signal ALE having an enable state.

The controller interface circuitry 1210 may transmit the read enable signal nRE to the memory device 1100 through the fifth pin P25. The controller interface circuitry 1210 may receive or transmit the data strobe signal DQS from or to the memory device 1100 through the sixth pin P26.

In a data (DATA) output operation of the memory device 1100, the controller interface circuitry 1210 may generate a read enable signal nRE, which toggles, and transmit the read enable signal nRE to the memory device 1100. For example, before outputting data DATA, the controller interface circuitry 1210 may generate a read enable signal nRE, which is changed from a static state (e.g., a high level or a low level) to a toggling state. Thus, the memory device 1100 may generate a data strobe signal DQS, which toggles, based on the read enable signal nRE. The controller interface circuitry 1210 may receive the data signal DQ including the data DATA along with the data strobe signal DQS, which toggles, from the memory device 1100. The controller interface circuitry 1210 may obtain the data DATA from the data signal DQ based on a toggle time point of the data strobe signal DQS.

In a data (DATA) input operation of the memory device 1100, the controller interface circuitry 1210 may generate a data strobe signal DQS, which toggles. For example, before transmitting data DATA, the controller interface circuitry 1210 may generate a data strobe signal DQS, which is changed from a static state (e.g., a high level or a low level) to a toggling state. The controller interface circuitry 1210 may transmit the data signal DQ including the data DATA to the memory device 1100 based on toggle time points of the data strobe signal DQS.

The controller interface circuitry 1210 may receive a ready/busy output signal nR/B from the memory device 1100 through the eighth pin P28. The controller interface circuitry 1210 may determine state information of the memory device 1100 based on the ready/busy output signal nR/B.

In an embodiment, the memory device 1100 may be the memory device described with reference to FIGS. 1 to 14 and may include the voltage generating circuit described with reference to FIGS. 1 to 14.

Figure 16:
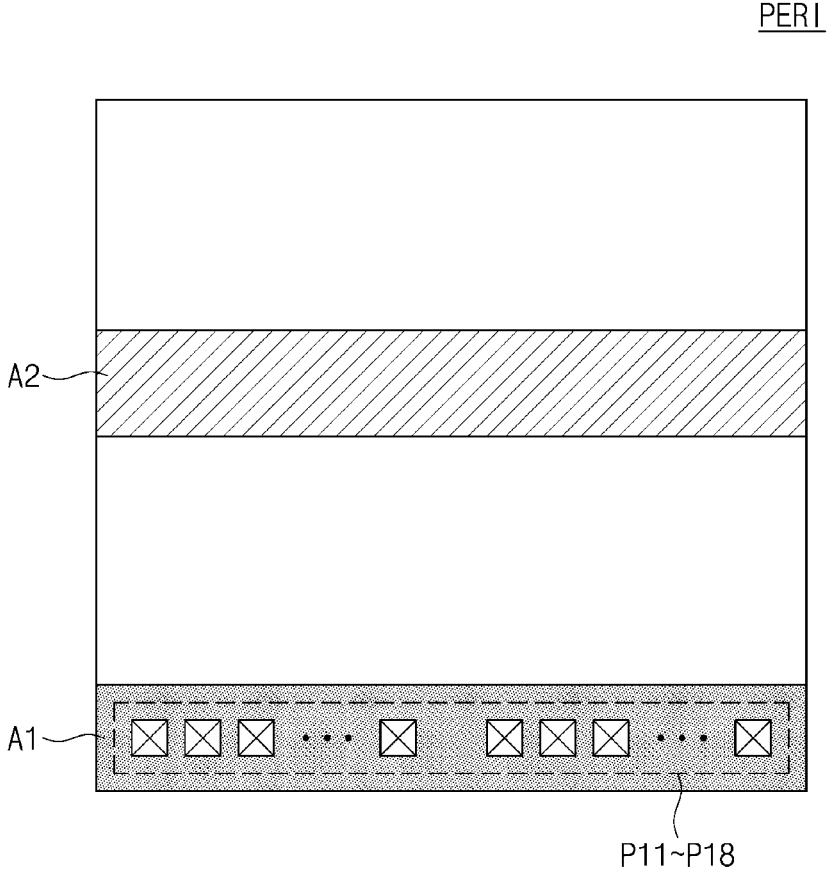
FIG. 16 is a plan view of a peripheral circuit included in a memory device of FIG. 15 according to example embodiments.
Figure 17:
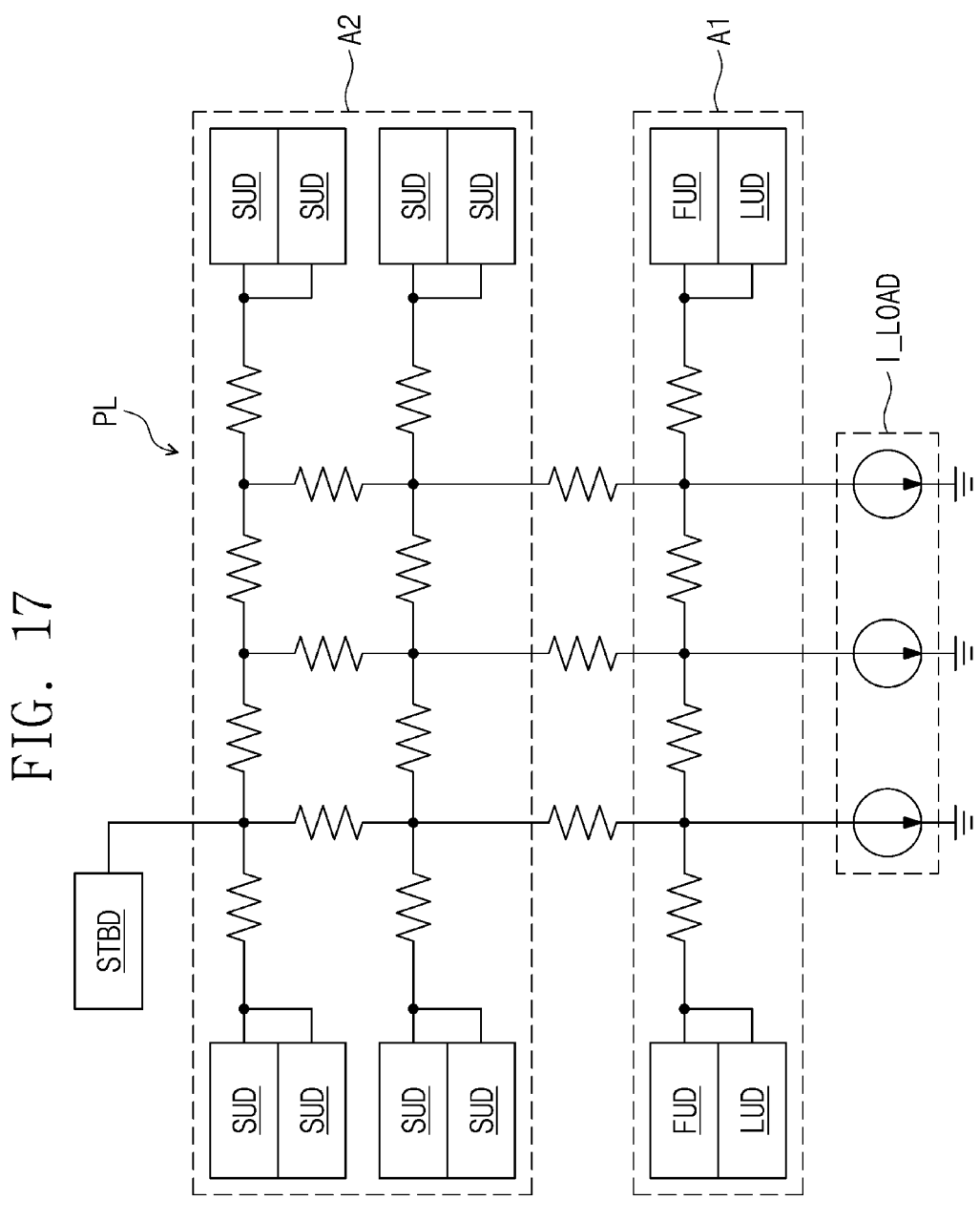
FIG. 17 is a diagram illustrating a voltage generating circuit formed in a peripheral circuit of FIG. 16 according to example embodiments.

FIG. 16 is a plan view of a peripheral circuit included in a memory device of FIG. 15 according to example embodiments. FIG. 17 is a diagram illustrating a voltage generating circuit formed in a peripheral circuit of FIG. 16 according to example embodiments. Referring to FIGS. to 17, the memory device 1100 may include a peripheral circuit PERI. The peripheral circuit PERI may include a memory interface circuitry 1110 and a control logic circuitry 1120 described with reference to FIG. 15.

In this case, as described with reference to FIG. 15, the plurality of pins P11 to P18 included in the memory interface circuitry 1110 may be disposed in a specific area (e.g., a first area A1) of the peripheral circuit PERI. The plurality of pins P11 to P18 may be pins for transmitting/receiving a command, an address, data or various other control signals with the memory controller 1200.

In an embodiment, the first area A1 may include driving circuits configured to control or drive the plurality of pins P11 to P18. The driving circuits may operate based on various operating voltages (e.g., the internal voltage IVC) generated from the voltage generating circuit 160 described with reference to FIG. 1.

The voltage generating circuit 160 or 160-a and the power line PL described with reference to FIG. 9 or 12 may be formed in the first area A1. That is, voltage regulators disposed adjacent to the plurality of driving circuits driving the plurality of pins P11 to P18 may have the structure described with reference to FIGS. 1 to 14 or may operate based on the method described with reference to FIGS. 1 to 14.

For example, as illustrated in FIG. 17, the fast unit driver FUD and the large unit driver LUD may be formed in the first area A1 and may be connected to the power line PL. The fast unit driver FUD and the large unit driver LUD may operate based on the operation methods described with reference to FIGS. 1 to 14.

In an embodiment, the voltage regulator and the power line PL configured to provide the internal voltage IVC may be formed in another area (e.g., a second area A2) of the peripheral circuit PERI. In an embodiment, the voltage regulator formed in the second area A2 may include unit drivers having the same operating characteristic. For example, as illustrated in FIG. 17, single unit drivers SUD may be formed in the second area A2 and may be connected to the power line PL. In an embodiment, each of the single unit drivers SUD may have the same operating characteristic (i.e., the same response speed and the same load current driving capability). In an embodiment, the single unit drivers SUD may be implemented with an LDO circuit including an amplifier and a pass transistor. The amplifier included in each of the single unit drivers SUD may be similar in structure or size to the fast amplifier included in the fast unit driver FUD and the large amplifier included in the large unit driver LUD, and the pass transistor included in each single unit driver SUD may be larger in size than the fast pass transistor included in the fast unit driver FUD or may be smaller in size than the large pass transistor included in the large unit driver LUD.

In an embodiment, the standby driver STBD may be connected to the power line PL, which is described above. Thus, additional description will be omitted to avoid redundancy.

As described above, the plurality of driving circuits configured to control the plurality of pins P11 to P18 may be disposed in the first area A1. Components such as the page buffer circuit 140 (refer to FIG. 1) may be disposed in the second area A2. In this case, the fast unit driver FUD and the large unit driver LUD may be disposed in the first area A1, and the single unit driver SUD may be disposed in the second area A2. The reason is that a driving circuit configured to control the plurality of pins P11 to P18 (in particular, DQ pins) uses a large load current during data-in and data-out operations performed to exchange the data "DATA" with the memory controller 1200 from among operations of the memory device 1100. As unit drivers that are disposed in an area adjacent to a component using a relatively large load current are implemented with a fast unit driver and a large unit driver, a fast response speed and a stable load current supply are possible.

However, the present disclosure is not limited thereto. For example, a voltage regulator disposed in the second area A2 or any other area may be configured to include the fast unit driver and the large unit driver, as described with reference to FIGS. 1 to 14.

Figure 18:
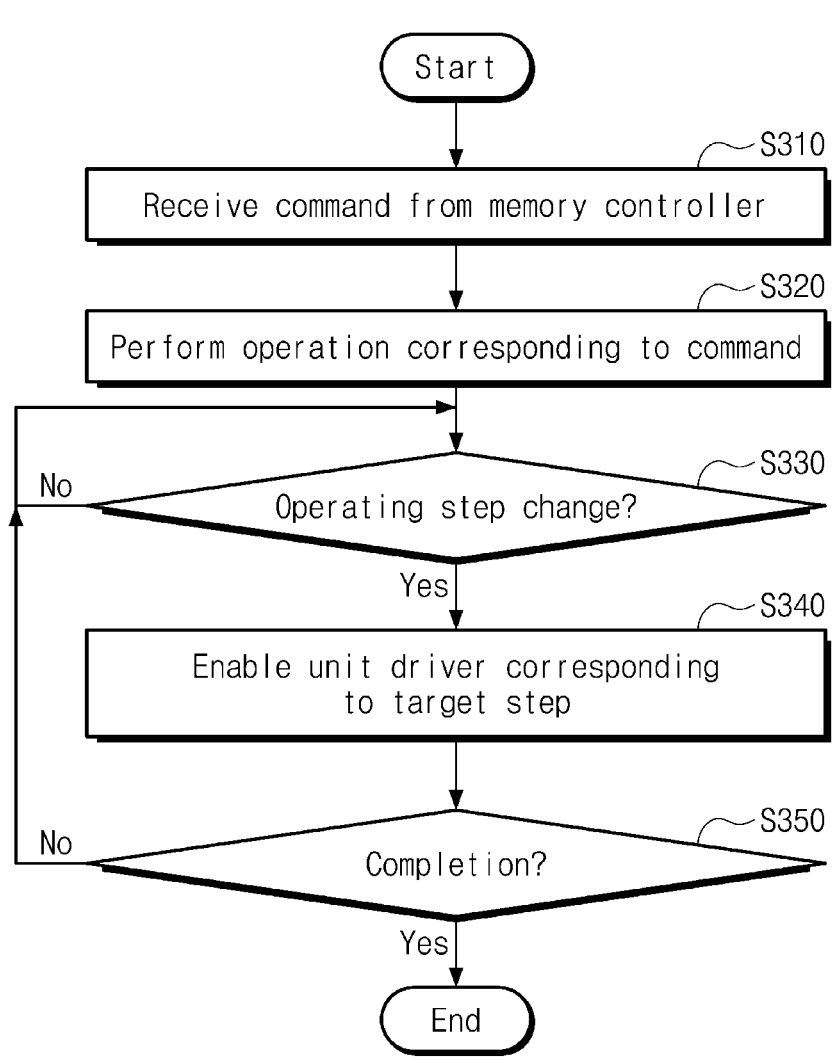
FIG. 18 is a flowchart illustrating an operation of a memory device of FIG. 15 according to example embodiments.

FIG. 18 is a flowchart illustrating an operation of a memory device of FIG. 15 according to example embodiments. Referring to FIGS. 15 and 18, in operation S310, the memory device 1100 may receive a command from the memory controller 1200. In operation S320, the memory device 1100 may perform an operation corresponding to the received command.

In operation S330, the memory device 1100 may determine whether an operating step is changed. For example, the operation corresponding to the received command may include a plurality of operating steps. In detail, when the received command is a read command, the memory device 1100 may perform a read operation on a selected word line. In this case, the read operation may include a bit line precharge step, a word line setup step, a bit line sensing step, and a data output step. As each step of the read operation is performed, the load current used in the memory device 1100 may change.

When it is determined that the operating step is changed, in operation S340, the memory controller 1200 may enable unit drivers corresponding to a target step. For example, while the memory device 1100 performs the read operation, when the operating step switches to the bit line sensing step, the memory device 1100 may enable unit drivers based on the load current required to perform the bit line sensing step. In this case, the number of unit drivers to be enabled may be determined based on a target level of the load current, and a kind of the unit drivers (e.g., a fast unit driver(s) and a large unit driver(s)) may be determined to be enabled based on the method described with reference to FIGS. 1 to 14.

In an embodiment, the location of unit drivers to be enabled (e.g., a peripheral location on the peripheral circuit PERI of FIG. 16) may be determined depending on the changed operating step. For example, when the changed operating step is the bit line sensing step, a large load current may be used by the page buffer circuit 140 (refer to FIG. 1) configured to sense a voltage change of a bit line. In this case, the memory device 1100 may be configured to enable unit drivers adjacent to the page buffer circuit 140.

In operation S350, the memory device 1100 may determine whether the operation corresponding to the received command is completed. When the operation is not completed, the memory device 1100 may perform operation S330.

Figure 19:
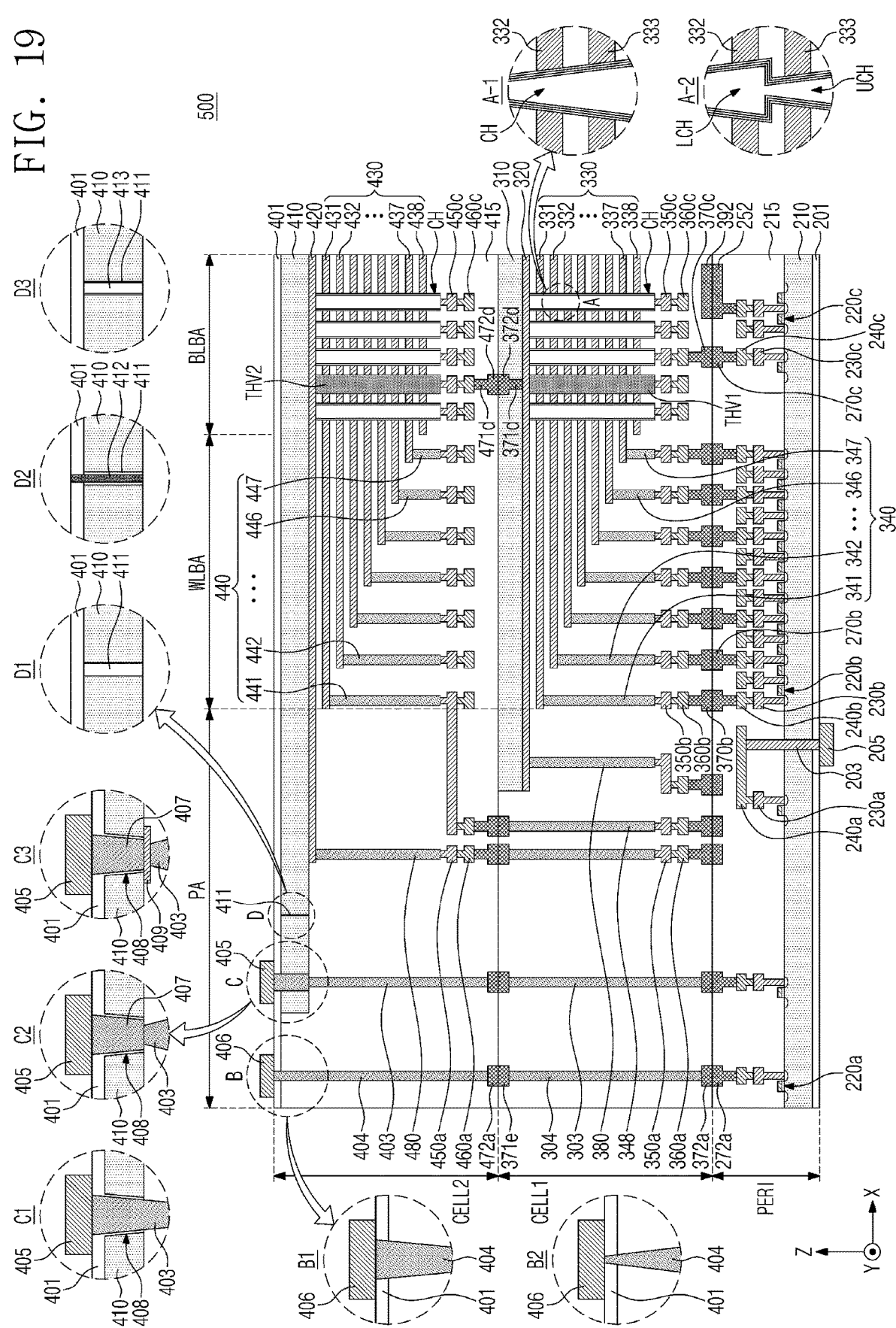
FIG. 19 is a view for describing a memory device according to an embodiment of the present disclosure.

FIG. 19 is a view illustrating a memory device according to some embodiments of the inventive concepts.

Referring to FIG. 19, a memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 19, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 19. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. Although not shown, at least one string selection line and at least one ground selection line may be disposed on and under the word lines 330, and the plurality of word lines 330 may be disposed between the at least one string selection line and the at least one ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A3', the channel structure CH may be provided in the bit line bonding region BLBA and may extend in the direction perpendicular to the top surface of the second substrate 310 to penetrate the word lines 330, the at least one string selection line, and the at least one ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A-2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the lower word lines 331 and 332 and contact the common source line 320. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A-2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a normal word line. A level of a voltage applied to the dummy word line may be different from a level of a voltage applied to the normal word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A-2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 19, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer (e.g., the page buffer circuit 140 of FIG. 1) included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring continuously to FIG. 19, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder (e.g., the address decoder 120 of FIG. 1) included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 19, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 13', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B 1', the third input/output contact plug 404 may extend in a third direction (e.g., the Z-axis direction), and a diameter of the third input/output contact plug 404 may become progressively greater toward the upper insulating layer 401. For example, a diameter of the channel structure CH described in the region 'A-1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 132', the third input/output contact plug 404 may extend in the third direction (e.g., the Z-axis direction), and a diameter of the third input/output contact plug 404 may become progressively less toward the upper insulating layer 401. For example, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

In an embodiment, the peripheral circuit region PERI of the memory device 500 may include the voltage generating circuit (or heterogeneous unit drivers) described with reference to FIGS. 1 to 18 and may operate based on the method described with reference to FIGS. 1 to 18.

According to an embodiment of the present disclosure, a voltage regulator with a reduced area and improved performance, a memory device including the voltage regulator, and an operation method of the memory device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a reference voltage generator configured to generate a reference voltage;
a voltage regulator including a plurality of driving blocks configured to generate an internal voltage based on the reference voltage;
a power line configured to receive the internal voltage; and
a regulator control circuit configured to enable the plurality of driving blocks, wherein at least one of the plurality of driving blocks includes:

a first unit driver configured to generate a first output current flowing through the power line based on the reference voltage and a change in the internal voltage; and a second unit driver configured to generate a second output current larger than the first output current flowing through the power line, based on the reference voltage and the change in the internal voltage, wherein the first unit driver is configured to generate the first output current faster than the second output current of the second unit driver, wherein the regulator control circuit is further configured to:

enable n driving blocks among the plurality of driving blocks, n being a natural number, when a load current flowing to the power line increases from a first value to a second value, and disable first unit drivers included in each of the n driving blocks when the load current is maintained at the second value.

2. The memory device of claim 1, wherein the first unit driver includes:

a first amplifier configured to output a first comparison signal based on a difference between the reference voltage and the internal voltage; and a first pass transistor connected between an external voltage and the power line, and configured to generate the first output current flowing through the power line in response to the first comparison signal, wherein the second unit driver includes:

a second amplifier configured to output a second comparison signal based on the difference between the reference voltage and the internal voltage; and a second pass transistor connected between the external voltage and the power line, and configured to generate the second output current flowing through the power line in response to the second comparison signal, wherein a size of the first amplifier is identical to a size of the second amplifier, and wherein a size of the second pass transistor is larger than a size of the first pass transistor.

3. The memory device of claim 2, wherein the first unit driver further includes a first capacitor connected between the power line and an output terminal of the first amplifier, wherein the second unit driver further includes a second capacitor connected between the power line and an output terminal of second first amplifier, and wherein a first ratio of the first capacitor and the second capacitor is proportional to a second ratio of the size of the first pass transistor and the size of the second pass transistor.

4. The memory device of claim 2, wherein the at least one of the plurality of driving blocks further includes:

a third unit driver configured to generate a third output current larger than the first output current and smaller than the second output current flowing through the power line, based on the reference voltage and the change in the internal voltage.

5. The memory device of claim 4, wherein the third unit driver includes:

a third amplifier configured to output a third comparison signal based on the difference between the reference voltage and the internal voltage; and a third pass transistor connected between the external voltage and the power line, and configured to generate the third output current flowing through the power line in response to the third comparison signal, wherein a size of the third amplifier is identical to the size of the first amplifier and the size of the second amplifier, and wherein a size of the third pass transistor is larger than the size of the first pass transistor and is smaller than the size of the second pass transistor.

6. The memory device of claim 1, wherein the regulator control circuit is further configured to enable m driving blocks among the plurality of driving blocks, m being a natural number greater than n, when the load current flowing through the power line increases from the second value to a third value.

7. The memory device of claim 1, further comprising:

an input/output circuit applying the internal voltage and configured to transmit/receive data to/from an external device.

8. The memory device of claim 7, wherein the regulator control circuit is further configured to:

enable the first unit driver and the second unit driver, at a time point when the input/output circuit starts to transmit/receive the data to/from the external device, and disable the first unit driver, while the input/output circuit transmits/receives the data to/from the external device.

9. The memory device of claim 1, further comprising:

a standby driver configured to provide the internal voltage to the power line during an idle period of the memory device.

10. The memory device of claim 1, wherein each of remaining driving blocks other than the at least one driving block includes:

a single unit driver connected to the power line, and configured to generate a third output current different from the first output current and the second output current flowing through the power line.

11. The memory device of claim 10, further comprising:

a substrate including a first area and a second area spaced from the first area as much as a given distance; and a plurality of pins disposed in the first area and configured to exchange signals with an external device, wherein the at least one of the plurality of driving blocks is formed in the first area, and wherein the remaining driving blocks are formed in second area.

12. The memory device of claim 1, further comprising:

a memory cell array including a plurality of memory cells;

an address decoder connected to the memory cell array through a plurality of word lines;

a page buffer circuit connected to the memory cell array through a plurality of bit lines;

an input/output circuit connected to the page buffer circuit; and a control logic circuit configured to control the address decoder, the page buffer circuit, and the input/output circuit.

13. The memory device of claim 12, wherein at least one of the memory cell array, the address decoder, the page buffer circuit, the input/output circuit, and the control logic circuit is:

connected to the power line, and configured to operate based on the internal voltage provided through the power line.

14. An operation method of a memory device which includes a plurality of driving blocks configured to output an internal voltage to a power line, the method comprising:

enabling n driving blocks among the plurality of driving blocks, in a first operating period in which a first load current is used, n being a natural number;

enabling m driving blocks among the plurality of driving blocks, in a second operating period in which a second load current larger than the first load current is used, m being a natural number greater than n; and when the second load current is maintained at a target level disabling a first unit driver included in each of the m driving blocks, wherein the enabling of the n driving blocks includes:

by a first unit driver of at least one of the plurality of driving blocks, generating a first output current flowing through the power line based on a reference voltage and a change in the internal voltage; and by a second unit driver of the at least one of the plurality of driving blocks, generating a second output current larger than the first output current flowing through the power line based on the reference voltage and the change in the internal voltage, and wherein the generating of the first output current occurs faster than the generating of the second output current.

15. The method of claim 14, wherein the second operating period is a period in which the memory device transmits/receives data to/from an external device.

16. A memory device comprising:

a reference voltage generator configured to generate a reference voltage;

a voltage regulator including a plurality of driving blocks configured to generate an internal voltage based on the reference voltage; and a power line configured to receive the internal voltage, wherein at least one of the plurality of driving blocks includes:

a first unit driver configured to generate a first output current flowing through the power line based on the reference voltage and a change in the internal voltage; and a second unit driver configured to generate a second output current larger than the first output current flowing through the power line, based on the reference voltage and the change in the internal voltage, wherein the first unit driver is configured to generate the first output current faster than the second output current of the second unit driver, wherein one of remaining driving blocks other than the at least one of the plurality of driving blocks includes:

a single unit driver connected to the power line, and configured to generate a third output current different from the first output current and the second output current flowing through the power line, and wherein the first, second, and third output currents are combined into the power line.

\* \* \* \* \*